(12) United States Patent
Song et al.

(10) Patent No.: US 10,542,621 B2
(45) Date of Patent: Jan. 21, 2020

(54) CONDUCTIVE PATTERN AND DISPLAY DEVICE HAVING THE SAME

(71) Applicant: SAMSUNG DISPLAY CO., LTD., Yongin-si, Gyeonggi-do (KR)

(72) Inventors: Ji Hoon Song, Yongin-si (KR); Hyun Chul Son, Yongin-si (KR); Young Je Shin, Yongin-si (KR); Kyong Hun Cho, Yongin-si (KR); Jeong Bai Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/858,026

(22) Filed: Dec. 29, 2017

(65) Prior Publication Data

US 2018/0192512 A1 Jul. 5, 2018

(30) Foreign Application Priority Data

Dec. 30, 2016 (KR) ......................... 10-2016-0183376

(51) Int. Cl.

| H01L 27/32 | (2006.01) |
|---|---|
| H05K 1/02 | (2006.01) |
| H05K 1/03 | (2006.01) |
| H05K 1/09 | (2006.01) |
| H05K 5/00 | (2006.01) |

(52) U.S. Cl.
CPC ....... *H05K 1/0298* (2013.01); *H01L 27/3248* (2013.01); *H01L 27/3288* (2013.01); *H05K 1/0313* (2013.01); *H05K 1/09* (2013.01); *H05K 5/0017* (2013.01)

(58) Field of Classification Search
None
See application file for complete search history.

(56) References Cited

U.S. PATENT DOCUMENTS

| 5,691,240 | A | 11/1997 | Yang |
| 5,972,179 | A | 10/1999 | Chittipeddi et al. |
| 6,069,072 | A | 5/2000 | Konecni et al. |
| 6,960,786 | B2 * | 11/2005 | Yamazaki ........... H01L 27/3244 257/59 |
| 7,402,948 | B2 | 7/2008 | Yamazaki et al. |

(Continued)

FOREIGN PATENT DOCUMENTS

| JP | 2006-332603 A | 12/2006 |
| KR | 10-1155903 B1 | 6/2012 |
| KR | 10-2015-0053635 A | 5/2015 |

OTHER PUBLICATIONS

Ajit Paranjpe and Mazhar Islamraja, "Chemical vapor deposition TiN process for contact/via barrier applications", J. Vac. Sci. Technol. B. (Sep./Oct. 1995) 2105-2114, vol. 13, No. 5, American Vacuum Society.

(Continued)

*Primary Examiner* — Chandra Chaudhari
(74) *Attorney, Agent, or Firm* — Innovation Counsel LLP

(57) ABSTRACT

A conductive pattern includes an organic insulating layer, a first conductive layer provided on the insulating layer and including at least a first sub-conductive layer, and an additional conductive layer provided between the insulating layer and the first conductive layer, or on the first conductive layer, wherein the additional conductive layer includes a metal nitride.

47 Claims, 14 Drawing Sheets

(56) References Cited

U.S. PATENT DOCUMENTS

| | | | |
|---|---|---|---|
| 7,579,771 B2* | 8/2009 | Yamazaki | H01L 27/3246 |
| | | | 313/504 |
| 8,558,235 B2 | 10/2013 | Yoon et al. | |
| 8,890,406 B2 | 11/2014 | Kang et al. | |
| 8,933,444 B2 | 1/2015 | Saito et al. | |
| 2003/0201447 A1 | 10/2003 | Yamazaki et al. | |
| 2011/0037072 A1 | 2/2011 | Moriwaki | |
| 2015/0132520 A1 | 5/2015 | Han et al. | |
| 2015/0295092 A1 | 10/2015 | Misaki | |
| 2018/0164933 A1* | 6/2018 | Jun | H01L 27/32 |

OTHER PUBLICATIONS

Extended European Search Report dated May 14, 2018, 9pages.
C.-K Hu et al., "Copper interconnections and reliability," Elsevier Mater & Chemistry and Physics, vol. 52, Jan. 1, 1998, pp. 5-16.

* cited by examiner

CONDUCTIVE PATTERN AND DISPLAY DEVICE HAVING THE SAME

CROSS-REFERENCE TO RELATED APPLICATION

This application claims priority to, and the benefit of, Korean Patent Application No. 10-2016-0183376 filed on Dec. 30, 2016 in the Korean Intellectual Property Office, the entire contents of which are incorporated herein by reference in their entirety.

BACKGROUND

1. Field

Embodiments of the inventive concept relate to a conductive pattern and a display device having the same.

2. Description of the Related Art

A display device may include a plurality of pixels including display elements. Wring lines and at least one transistor connected to the wiring lines and configured to drive the display device may be arranged in each of the pixels. The transistor may be electrically connected to the display device and drive the display element by using signals applied from the wring lines.

At least a portion of the wiring lines may be disposed on an organic layer and lower portions of the wiring lines may directly contact the organic layer. When the wiring lines directly contact the organic layer, the wiring lines and the organic layer may react with each other during the formation of the wiring lines, so that an oxide of a material included in the wiring lines or a composite material including materials included in the organic layer and the wiring lines may be formed at the interface between the wiring lines and the organic layer.

The oxide or the composite material may not be removed at the same time as the material included in the wiring lines when the wiring lines are patterned.

SUMMARY

Embodiments of the inventive concept provide a conductive pattern preventing a reaction with an organic layer.

Embodiments of the inventive concept also provide a display device including the conductive pattern.

According to some exemplary embodiments of the present inventive concept, a conductive pattern may include an insulating layer including organic material, a first conductive layer provided on the insulating layer and including at least a first sub-conductive layer, and an additional conductive layer provided between the insulating layer and the first conductive layer, or on the first conductive layer, wherein the additional conductive layer includes a metal nitride.

The additional conductive layer may be a second conductive layer provided between the insulating layer and the first conductive layer.

The first conductive layer may further include a second sub-conductive layer provided between the second conductive layer and the first sub-conductive layer, and the second conductive layer may include a nitride of a material included in the second sub-conductive layer.

The second sub-conductive layer may include titanium (Ti).

The second conductive layer may include a titanium nitride.

The conductive pattern may further include a third sub-conductive layer provided on the first sub-conductive layer, wherein the third sub-conductive layer includes the same material as the second sub-conductive layer.

The third sub-conductive layer may include titanium (Ti).

The conductive pattern may further include a third conductive layer provided on the first sub-conductive layer, wherein the third conductive layer includes the same material as the second conductive layer.

The third conductive layer may include a titanium nitride.

The first sub-conductive layer may include at least one of gold (Au), silver (Ag), copper (Cu), aluminum (Al) and an alloy thereof.

According to some exemplary embodiments of the present inventive concept, a display device may include a substrate including a display area and a non-display area, at least one transistor provided in the display area of the substrate, a first insulating layer covering the transistor, a first bridge pattern provided on the first insulating layer and connected to the transistor, a second insulating layer covering the first bridge pattern and including an organic insulating material, a second bridge pattern provided on the second insulating layer and connected to the first bridge pattern, and a display element connected to the second bridge pattern, wherein the second bridge pattern comprises: a first conductive layer including at least a first sub-conductive layer, and a second conductive layer provided between the second insulating layer and the first conductive layer, wherein the second conductive layer includes a metal nitride.

The first insulating layer includes an organic insulating material, wherein the first bridge pattern comprises: a first conductive layer provided on the first insulating layer and including at least a first sub-conductive layer, and a second conductive layer provided between the first insulating layer and the first conductive layer, wherein the second conductive layer includes a metal nitride.

According to some exemplary embodiments of the present inventive concept, a display device may include a substrate including a display area and a non-display area, at least one transistor provided in the display area of the substrate, a display element connected to the transistor, and a conductive pattern connected to the transistor or the display element and provided on an organic layer, wherein the conductive pattern comprises: a first conductive layer including at least a first sub-conductive layer, and a second conductive layer provided between the organic layer and the first conductive layer, wherein the second conductive layer includes a metal nitride.

According to some exemplary embodiments of the present inventive concept, a conductive pattern may include an insulating layer including organic material, a first conductive layer provided on the insulating layer and including at least a first sub-conductive layer, and an additional conductive layer provided between the insulating layer and the first conductive layer, or on the first conductive layer, wherein the additional conductive layer includes a material not reacting with a material included in the insulating layer.

DETAILED DESCRIPTION

Figure 1:
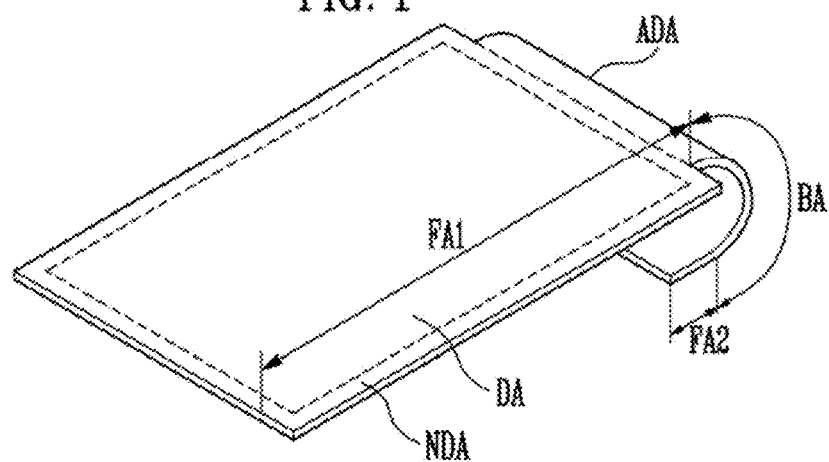
FIG. 1 is a perspective view illustrating a display device according to an embodiment of the present inventive concept.

Various modifications and changes may be applied to the examples of embodiments in accordance with the concepts so that the examples of embodiments will be illustrated in the drawings and described in the specification. However, the examples of embodiments according to the concepts are not limited to the specific embodiments, but include all changes, equivalents, or alternatives which are included in the spirit and technical scope of the present disclosure.

Like reference numerals are used for referring to the same or similar elements in the description and drawings. In the attached drawings, the dimensions of the components exaggerated for clarity of illustration. Terminologies such as first or second may be used to describe various components but the components are not limited by the above terminologies. The above terminologies are used to distinguish one component from the other component, for example, a first component may be referred to as a second component without departing from a scope in accordance with the concept of the present inventive concept and similarly, a second component may be referred to as a first component. The terms of a singular form may include plural forms unless referred to the contrary.

In the present inventive concept, it will be appreciated that terms "including" and "having" are intended to designate the existence of characteristics, numbers, steps, operations, constituent elements, and components described in the specification or a combination thereof, and do not exclude a possibility of the existence or addition of one or more other specific characteristics, numbers, steps, operations, constituent elements, and components, or a combination thereof in advance. It will be understood that when an element such as a layer, film, area, or substrate is referred to as being "on" another element, it can be directly on the other element or intervening elements may also be present. On the contrary, it will be understood that when an element such as a layer, film, area, or substrate is referred to as being "beneath" another element, it can be directly beneath the other element or intervening elements may also be present.

Hereinafter, aspects of some exemplary embodiments will be described in more detail with reference to the accompanying drawings.

Figure 2:
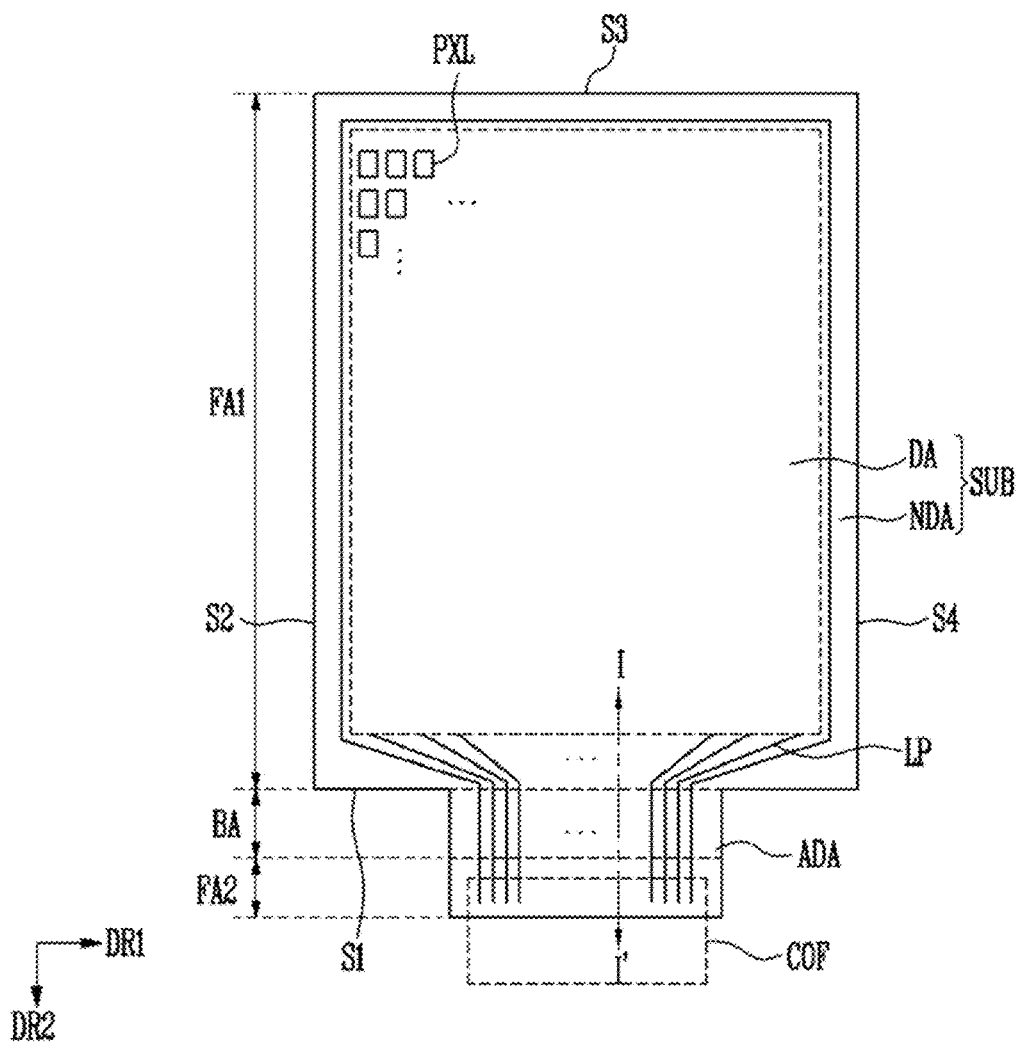
FIG. 2 is a plan view illustrating a display device shown in FIG. 1.

FIG. 1 is a perspective view illustrating a display device according to an embodiment. FIG. 2 is a plan view illustrating the display device shown in FIG. 1.

Referring to FIGS. 1 and 2, a display device according to an embodiment may include a substrate SUB, pixels PXL provided on the substrate SUB, and wiring lines LP connected to the pixels PXL.

The substrate SUB may include a display area DA and a non-display area NDA provided on at least one side of the display area DA.

The substrate SUB may have various shapes. For example, the substrate SUB may have a closed polygonal shape including straight sides. In addition, the substrate SUB may have a shape such as a circle and an ellipse including a curved surface. In addition, the substrate SUB may have a semi-circular or semi-elliptical shape including curved and straight sides. According to an embodiment, when the substrate SUB includes straight sides, at least some of the corners of the angular shape may be curved. For example, when the substrate SUB has a rectangular shape, a portion where adjacent straight sides meet may be replaced by a curve having a predetermined curvature. In other words, a vertex of the rectangular shape may include a curved side having both adjacent sides connected to two adjacent straight sides and having a predetermined curvature. This curvature may vary depending on the position. For example, the curvature may vary depending on the start position of the curve starts and a length of the curve.

The substrate SUB may include the display area DA and the non-display area NDA. The pixels PXL displaying an image may be provided on the display area DA. Each of the pixels PXL is described below. The pixels PXL may not be provided on the non-display area NDA, where an image may not be displayed. Some of the wiring lines LP connecting the pixels PXL to a driver COF may be provided on the non-display area NDA. The non-display area NDA may correspond to a bezel of the final display device, and a width of the bezel may be determined depending on a width of the non-display area NDA.

The plurality of pixels PXL may be provided on the display area DA, where an image may be displayed. The display area DA may have a shape corresponding to the shape of the substrate SUB. For example, like the shape of the substrate SUB, the display area DA may have a closed polygonal shape including straight sides. In addition, the display area DA may have a circular or elliptical shape including a curved side. The display area DA may have a semi-circular or semi-elliptical shape including straight and curved sides. According to an embodiment, when the display area DA has straight sides, at least some of the corners of the angular shape may be curved. For example, when the display area DA has a rectangular shape, a portion where adjacent straight sides meet may be replaced by a curve having a predetermined curvature. In other words, a vertex of the rectangular shape may include a curved side having both adjacent ends connected to two adjacent straight lines and having a predetermined curvature. This curvature may vary depending on the position. For example, the curvature may be changed depending on the start position of the curve starts and a length of the curve.

The pixels PXL may be provided on the display area DA of the substrate SUB. Each of the pixels PXL may be a minimum unit for displaying an image. The plurality of pixels PXL may be provided on the display area DA. The pixels PXL may emit white light and/or color light. For example, each pixel PXL may emit light of one of red, green, and blue. However, the inventive concept is not limited thereto. For example, each pixel PXL may also emit light of one of cyan, magenta and yellow.

The pixels PXL may be the basic unit for displaying an image and include various display elements (not illustrated). For example, each of the pixels PXL may include one of a liquid crystal (LCD) element, an electrophoretic display (EPD) element, an electrowetting display (EWD) element, and an organic light emitting display (OLED) element. Hereinafter, for convenience of explanation, the OLED element is described as an example of a display element OLED.

The wiring lines LP may connect the pixels PXL to the driver COF. The driver COF may provide signals to the respective pixels PXL through the wiring lines LP, thereby controlling the driving of each pixel PXL.

The driver COF may include a scan driver (not illustrated) providing a scan signal to the pixel PXL along a scan line (not illustrated), a data driver providing a data signal to the pixel PXL along the data line (not illustrated), and a timing controller (not illustrated) controlling the scan driver and the data driver.

According to an embodiment, the scan driver may be directly formed on the substrate SUB. When the scan driver is directly formed on the substrate SUB, the scan driver may be formed together at the same time when the pixels PXL are formed. However, the position and the method of providing the scan driver may not be limited thereto. For example, the scan driver may be formed in a separate chip and provided in a chip-on-glass type on the substrate SUB, or the scan driver may be provided on a printed circuit board (SUB), which may be connected to the substrate SUB by a connecting member.

According to an embodiment, the data driver may be directly formed on the substrate SUB. However, the inventive concept is not limited. For example, the data drive may be formed in a separate chip and connected to the substrate SUB. According to an embodiment, when the data driver is formed in the separate chip and connected to the substrate SUB, the data driver may be provided using a chip-on-glass method or a chip-on-plastic method. In another example, the data driver may be provided on the printed circuit board (SUB) and connected to the substrate SUB by a connecting member. According to an embodiment, the data driver may be manufactured as a chip-on-film type data driver, which may be connected to the substrate SUB.

According to an embodiment, the non-display area NDA may further include an additional area ADA extending from a portion thereof. The additional area ADA may protrude from sides forming the non-display area NDA. FIG. 2 shows the additional area ADA protruding from a side corresponding to one of the short sides of the substrate SUB. However, the additional area ADA may also protrude from one of the long sides, or two or more of the four sides. According to an embodiment, the data driver may be provided on or connected to the additional area ADA. However, the inventive concept is not limited thereto, and various components may be provided on the additional area ADA.

According to an embodiment, a portion of the display device may have flexibility and the display device may be folded at the flexible portion. The display device may include a bent area BA that has flexibility and is folded in one direction and a flat area FA which is provided on at least one side of the bent area BA and is not folded. The flat area FA may or may not have flexibility.

FIGS. 1 and 2 illustrate the bent area BA provided on the additional area ADA. According to an embodiment, a first flat area FA1 and a second flat area FA2 may be provided at both sides of the bent area BA. For example, the first flat area FA1 may be provided at one side of the bent area BA and the second flat area FA2 may be provided at the other side of the bent area BA. The first flat area FA1 may include the display area DA.

In the bent area BA, when the display device is folded along a folding line, the bending line may be provided in the bent area BA. The term "being fold" may mean that the shape is not fixed but may change from the original form to another form. When the display device is folded, it may mean that the display is folded along at least one predetermined folding line, curved, or rolled up like a scroll. Therefore, according to an embodiment, it is illustrated that the display device is folded so that respective surfaces of the two flat areas FA1 and FA2 may be located in parallel and oppose each other. However, the inventive concept is not limited thereto. The display device may be folded so that the respective surfaces of the flat areas FA1 and FA2 may form a predetermined angle (e.g., an acute angle or an obtuse angle) with the bent area BA interposed therebetween.

According to an embodiment, the additional area ADA may be bent along the folding line. When the additional area ADA is bent, a width of the non-display area NDA may be reduced, and the width of the display device may also be reduced.

Figure 3:
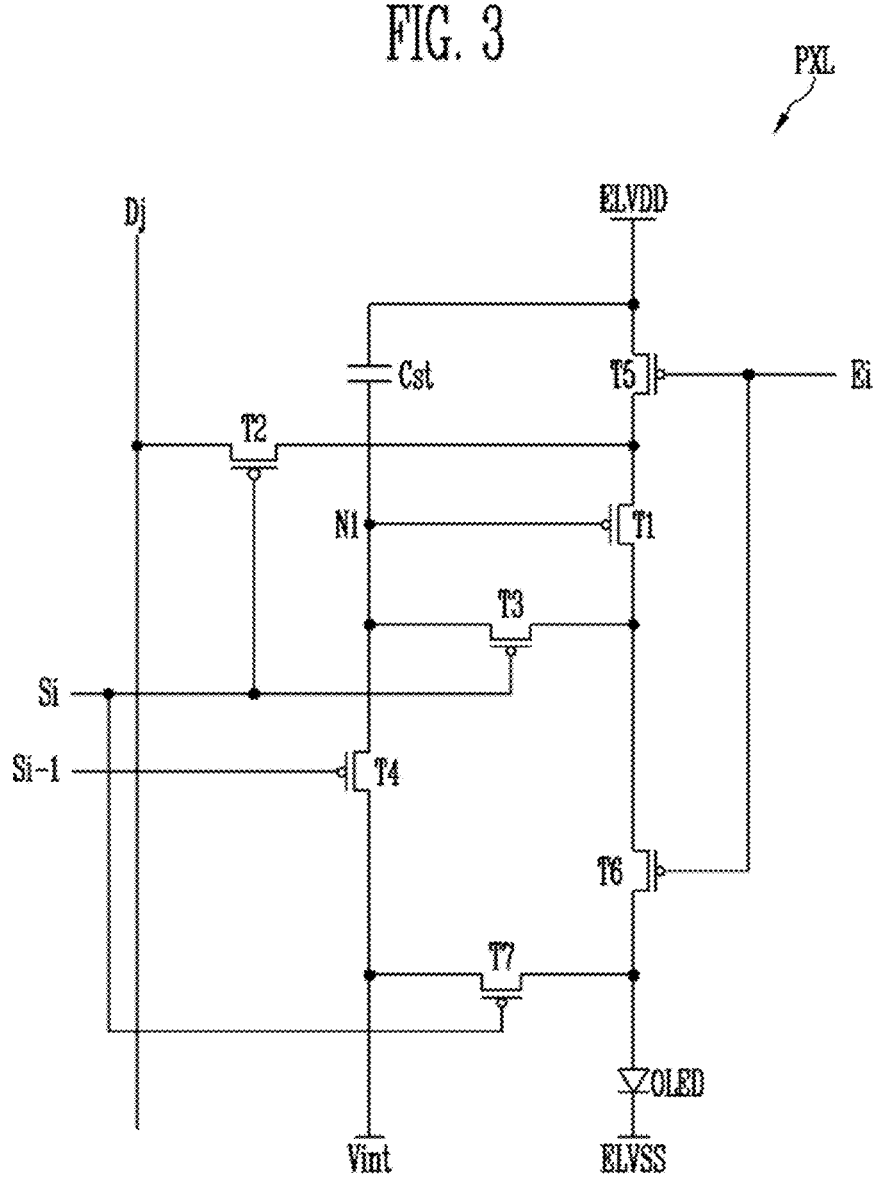
FIG. 3 is an equivalent circuit diagram illustrating a pixel according to an embodiment of the present inventive concept.

FIG. 3 is an equivalent circuit diagram illustrating a pixel according to an embodiment. For convenience of explanation, FIG. 3 illustrates a pixel connected to a jth data line Dj and an ith scan line Si.

Referring to FIG. 3, the pixel PXL may include the display element OLED, a first transistor T1, a second transistor T2, a third transistor T3, a fourth transistor T4, a fifth transistor T5, a sixth transistor T6, a seventh transistor T7, and a storage capacitor Cst. According to an embodiment, the pixel PXL including seven thin film transistors and one storage capacitor is illustrated an example. However, the inventive concept is not limited thereto. For example, the numbers of thin film transistors and storage capacitors included in the pixel PXL may be variously changed. For example, the pixel PXL may include two thin film transistors and one storage capacitor. In another example, the pixel PXL may include six thin film transistors and one storage capacitor.

An anode of the display element OLED may be connected to the first transistor T1 through the sixth transistor T6 and a cathode thereof may be connected to a second power supply ELVSS. The OLED element OLED may generate light with predetermined brightness according to current flows through the display element OLED.

A first power supply ELVDD may be set to a higher voltage than the second power supply ELVSS so that current may flow to the display element OLED.

The seventh transistor T7 may be connected between an initialization power supply Vint and the anode of the display element OLED. A gate electrode of the seventh transistor T7 may be connected to the ith scan line Si. The seventh transistor T7 may be turned on when a scan signal is supplied to the ith scan line Si, so that a voltage of the initialization power supply Vint may be supplied to the anode of the display element OLED. The initialization power supply Vint may be set to a lower voltage than a data signal.

The sixth transistor T6 may be connected between the first transistor T1 and the display element OLED. A gate electrode of the sixth transistor T6 may be connected to an ith emission control line Ei. The sixth transistor T6 may be turned off when a light emission control signal is supplied to the ith emission control line Ei and may be turned on during the remaining period.

The fifth transistor T1 may be connected between the first power supply ELVDD and the first transistor T1. A gate electrode of the fifth transistor T5 may be connected to the ith emission control line Ei. The fifth transistor T5 may be turned off when a light emission control signal is supplied to the ith emission control line Ei, and may be turned on during the remaining period.

A first electrode of the first transistor T1 (driving transistor) may be connected to the first power supply ELVDD through the fifth transistor T5, and a second electrode thereof may be connected to the anode of the display element OLED through the sixth transistor T6. A gate electrode of the first transistor T1 may be connected to a first node N1. The first transistor T1 may control the amount of current flowing from the first power supply ELVDD through the display element OLED to the second power supply ELVSS in response to a voltage of the first node N1. In other words, the first power supply ELVDD may be electrically connected to the anode of the display element OLED through the first transistor T1.

The third transistor T3 may be connected between the second electrode of the first transistor T1 and the first node N1. A gate electrode of the third transistor T3 may be connected to the ith scan line Si. The third transistor T3 may be turned on when the scan signal is supplied to the ith scan line Si to electrically connect the second electrode of the first transistor T1 to the first node N1. Therefore, when the third transistor T3 is turned on, the first transistor T1 may be connected in the form of a diode.

The fourth transistor T4 may be connected between the first node N1 and the initialization power supply Vint. A gate electrode of the fourth transistor T4 may be connected to an (i−1)th scan line Si−1. The fourth transistor T4 may be turned on when a scan signal is supplied to the (i−1)th scan line Si−1 to supply a voltage of the initialization power supply Vint to the first node N1.

The second transistor T2 may be connected between the jth data line Dj and the first electrode of the first transistor T1. The gate electrode of the second transistor T2 may be connected to the ith scan line Si. The second transistor T2 may be turned on when the scan signal is supplied to the ith scan line Si to electrically connect the jth data line Dj to the first electrode of the first transistor T1.

The storage capacitor Cst may be connected between the first power supply ELVDD and the first node N1. The storage capacitor Cst may store voltages corresponding to the data signal and a threshold voltage of the first transistor T1.

Figure 4:
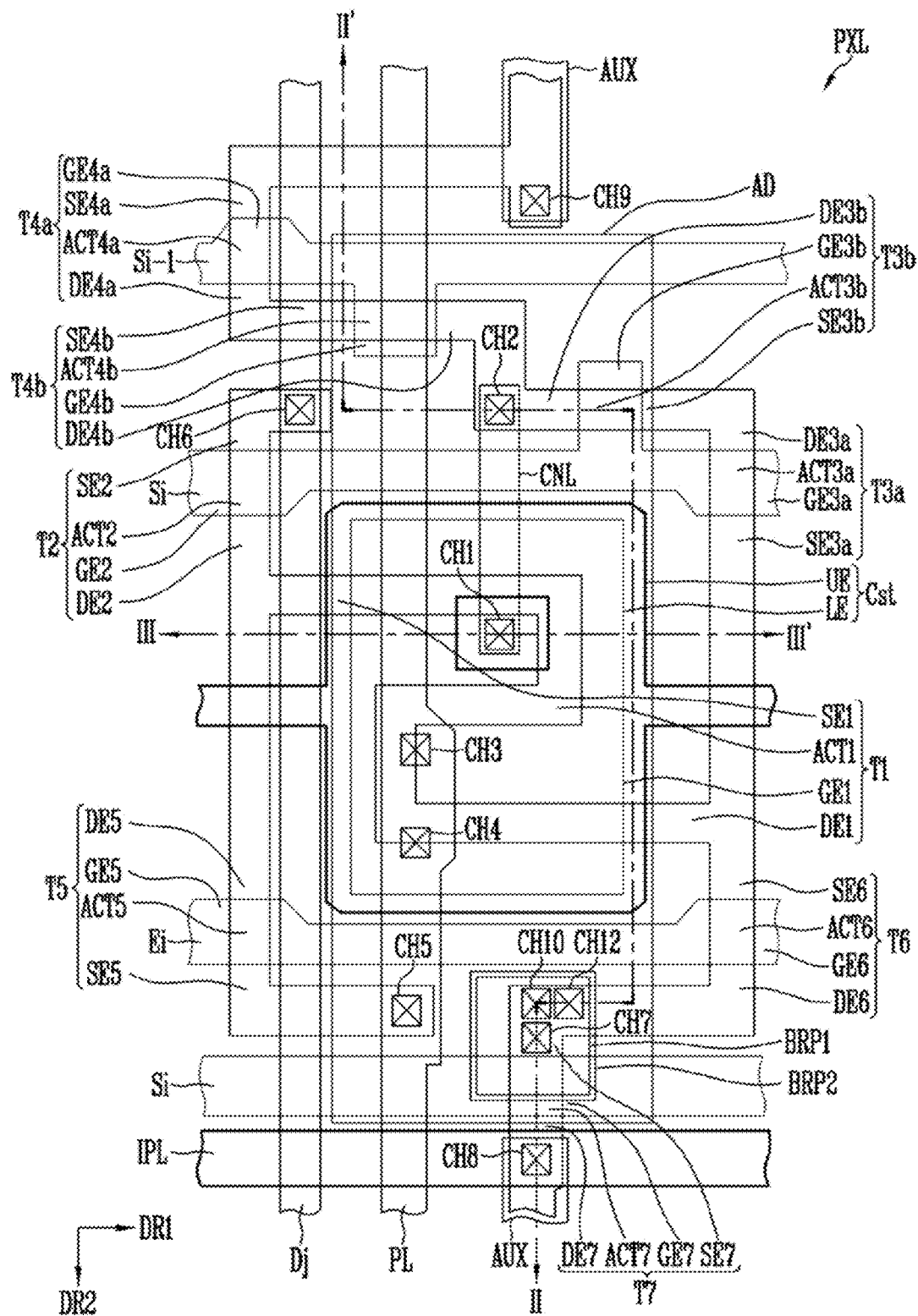
FIG. 4 is a detailed plan view illustrating a pixel shown in FIG. 3.
Figure 5:
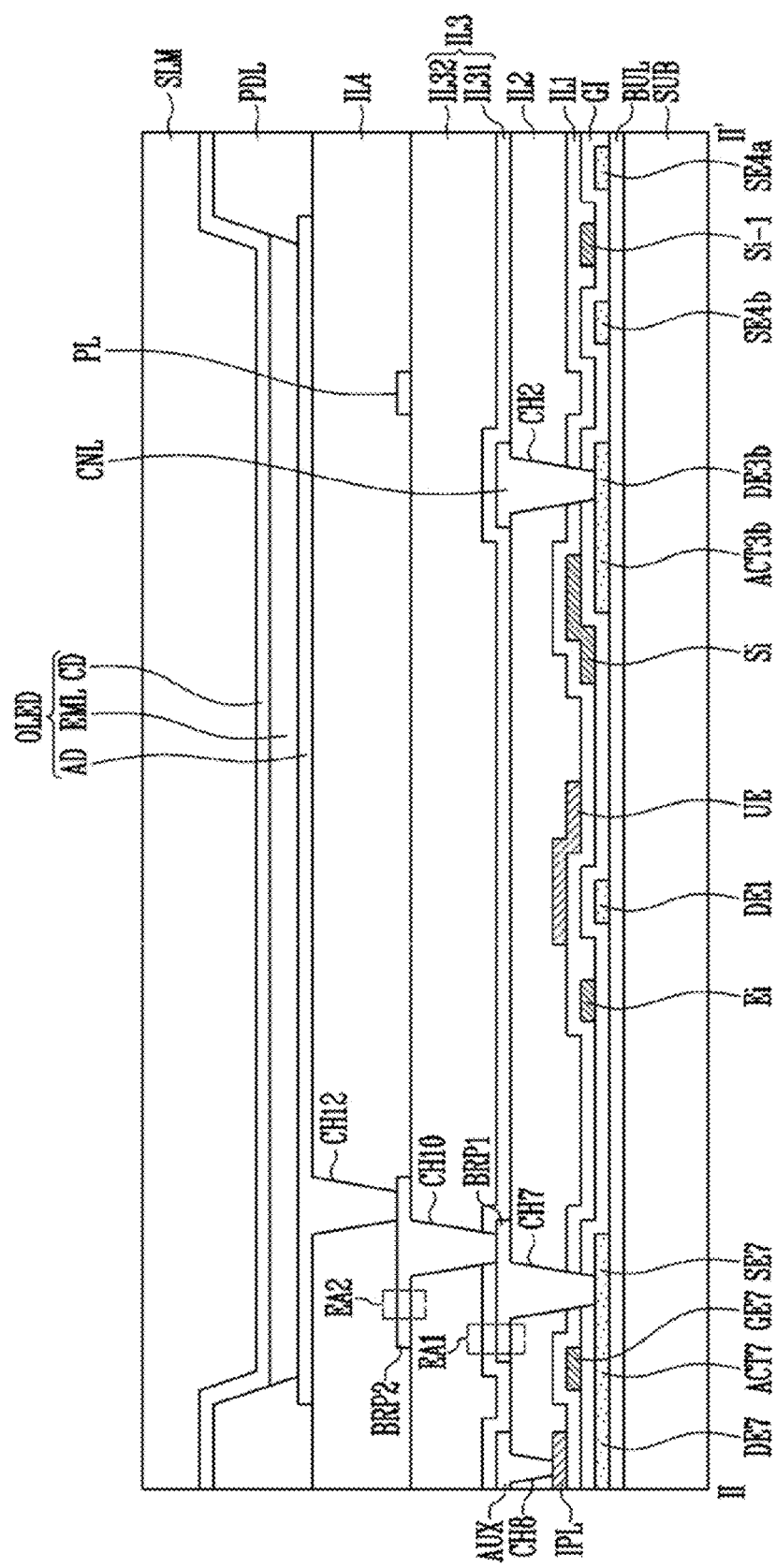
FIG. 5 is a cross-sectional diagram taken along the line II-II' of FIG. 4.
Figure 6:
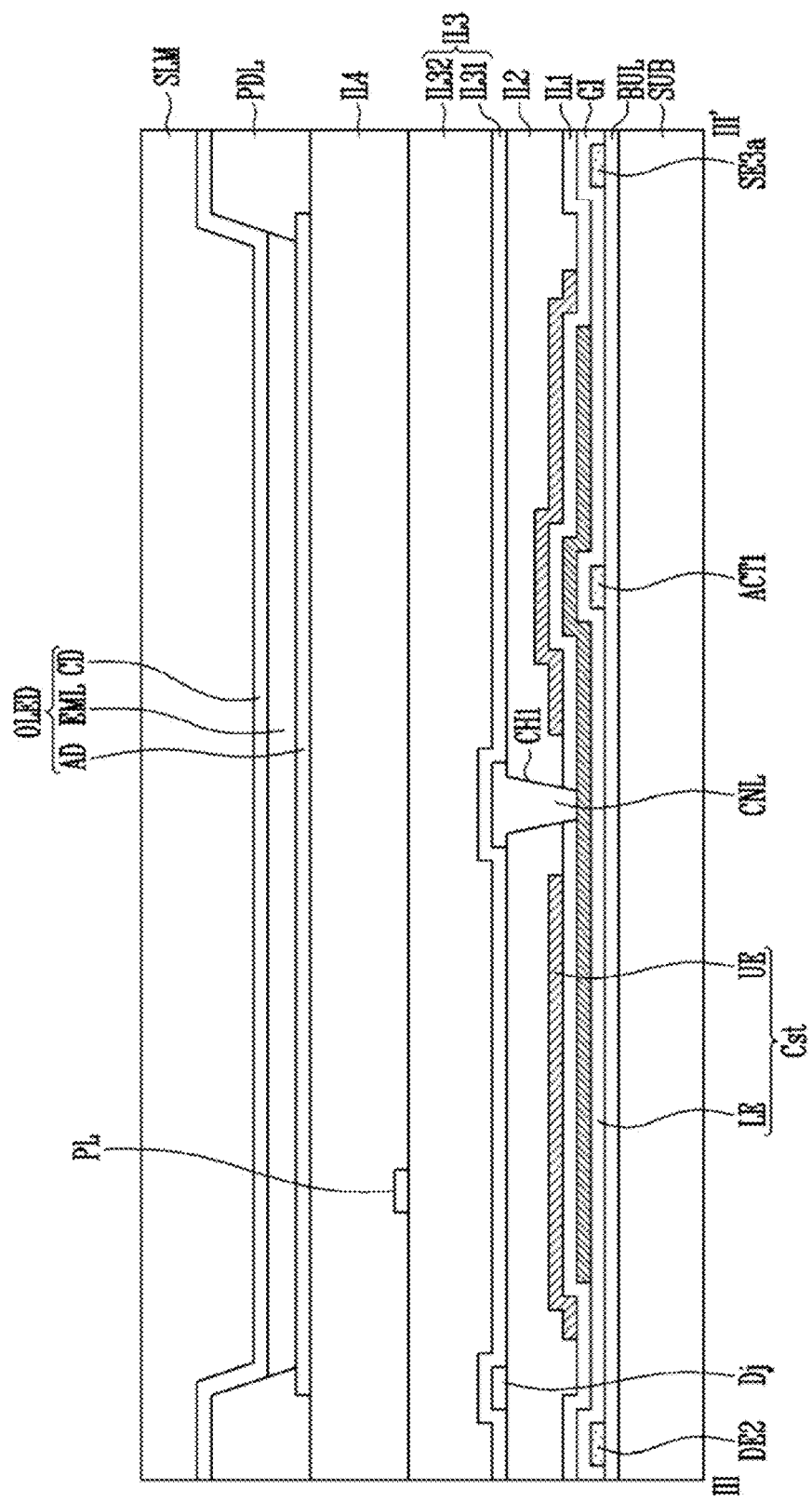
FIG. 6 is a cross-sectional diagram taken along the line III-III' of FIG. 4.

FIG. 4 is a detailed plan view of the pixel PXL shown in FIG. 3. FIG. 5 is a cross-sectional diagram taken along the line II-II' of FIG. 4. FIG. 6 is a cross-sectional diagram taken along the line III-III' of FIG. 4.

FIGS. 4 to 6 illustrate the two scan lines Si−1 and Si, the ith emission control line Ei, a power supply line PL, and the jth data line Dj connected to one pixel PXL arranged in an ith row and a jth column. In FIGS. 4 to 6, for convenience of explanation, a scan line in an (i−1)th row is referred to as an "(i−1)th scan line Si−1", a scan line in an ith row is referred to as an "ith scan line Si", an emission control line in the ith row is referred to as an "emission control line Ei", a data line in the jth column is referred to as a "data line Dj", and a jth power supply line is referred to as a "power supply line PL.".

Referring to FIGS. 1 to 6, the display device may include the substrate SUB and the pixels PXL.

The substrate SUB may include a transparent insulating material to transmit light. The substrate SUB may be a rigid substrate. For example, the substrate SUB may be one of a glass substrate, a quartz substrate, a glass ceramic substrate and a crystalline glass substrate.

In addition, the substrate SUB may be a flexible substrate. The substrate SUB may be one of a plastic substrate and a film substrate including a polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The material forming the substrate SUB may be variously changed and include fiber reinforced plastic (FRP).

The pixels PXL may be connected to the scan lines Si−1 and Si, the data line Dj, the emission control line Ei, the power supply line PL, and an initialization power supply line IPL.

The scan lines Si−1 and Si may extend in a first direction DR1. The scan lines Si−1 and Si may include the (i−1)th scan line Si−1 and two ith scan lines Si arranged sequentially in a second direction DR2. Scan signals may be supplied to the scan lines Si−1 and Si. For example, an (i−1)th scan signal may be supplied to the (i−1)th scan line Si−1. The (i−1)th scan line Si−1 may initialize the pixels PXL in the ith row in response to the (i−1)th scan signal. An ith scan signal may be applied to the ith scan lines Si. The first scan lines Si may be branched off from one line connected to the scan driver and may be connected to different transistors. For example, one of the ith scan lines Si may be connected to the second transistor T2 and the third transistor T3, among the first to seventh transistors T1 to T7 included in the pixels PXL, and the other may be connected to the seventh transistor T7, among the first to seventh transistors T1 to T7. In addition, a branch point of the first scan lines Si may be provided in the non-display area NDA adjacent to the display area DA. However, the inventive concept is not limited thereto. For example, the branch point of the first scan lines Si may be provided in the display area DA at a position adjacent to the non-display area NDA.

The emission control line Ei may extend in the first direction DR1. The emission control line Ei may be interposed between and separated from the two ith scan lines Si. A light emission control signal may be applied to the emission control line Ei.

The power supply line PL may extend in the second direction DR2. The power supply line PL may be separated from the data line Dj. The first power supply ELVDD may be applied to the power supply line PL.

The initialization power supply line IPL may extend in the first direction DR1. The initialization power supply line IPL may be provided between the pixel PXL in the ith pixel row and the pixel PXL in the (i+1)th pixel row. The initialization power supply Vint may be applied to the initialization power supply line IPL.

Each of the pixels PXL may include the first to seventh transistors T1 to T7, the storage capacitor Cst, and the display element OLED.

The first transistor T1 may include a first gate electrode GE1, a first active pattern ACT1, a first source electrode SE1, a first drain electrode DE1, and a connection line CNL.

The first gate electrode GE1 may be connected to a third drain electrode DE3 of the third transistor T3 and a fourth drain electrode DE4 of the fourth transistor T4. The connection line CNL may connect the first gate electrode GE1, the third drain electrode DE3 and the fourth drain electrode DE4 to each other. One end of the connection line CNL may be connected to the first gate electrode GE1 through a first contact hole CH1, and the other end of the connection line CNL may be connected to the third drain electrode DE3 and the fourth drain electrode DE4 through a second contact hole CH2.

According to an embodiment, each of the first active pattern ACT1, the first source electrode SE1, and the first drain electrode DE1 may include a semiconductor layer doped or undoped with impurities. For example, each of the first source electrode SE1 and the first drain electrode DE1 may include a semiconductor layer doped with impurities and the first active pattern ACT1 may include a semiconductor layer undoped with impurities.

The first active pattern ACT1 may have a bar shape extending in a predetermined direction and be bent several times in the extended length direction. As viewed in the plane, the first active pattern ACT1 may overlap with the first gate electrode GE1. Since the first active pattern ACT1 extends in the predetermine direction, a channel region of the first transistor T1 may also extend in the predetermined direction, thus, the channel length of the first transistor T1 may be long. Therefore, a driving range of a gate voltage applied to the first transistor T1 may be broadened. Therefore, minute grayscale control of light emitted from the display element OLED may be allowed.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and a second drain electrode DE2.

The second gate electrode GE2 may be connected to the ith scan line Si. The second gate electrode GE2 may be provided as a portion of the ith scan line Si, or may protrude from the ith scan line Si. According to an embodiment, each of the second active pattern ACT2, the second source electrode SE2 and the second drain electrode DE2 may include a semiconductor layer doped or undoped with impurities. For example, each of the second source electrode SE2 and the second drain electrode DE2 may include a semiconductor layer doped with impurities and the second active pattern ACT2 may be a semiconductor layer undoped with impurities. The second active pattern ACT2 may correspond to an overlapping portion between the second source and drain electrodes SE2 and DE2 and the second gate electrode GE2. One end of the second source electrode SE2 may be connected to the second active pattern ACT2 and the other end of the second source electrode SE2 may be connected to the data line Dj through a sixth contact hole CH6. One end of second drain electrode DE2 may be connected to the second active pattern ACT2 and the other end thereof may be connected to the first source electrode SE1 of the first transistor T1 and the fifth drain electrode DE5 of the fifth transistor T5.

The third transistor T3 may be provided as a dual gate structure to prevent current leakage. In other words, the third transistor T3 may include a 3a-th transistor T3$a$ and a 3b-th transistor T3$b$. The 3a-th transistor T3$a$ may include a 3a-th gate electrode GE3$a$, a 3a-th active pattern ACT3$a$, a 3a-th source electrode SE3$a$, and a 3a-th drain electrode DE3$a$. The 3b-th transistor T3$b$ may include a 3b-th gate electrode GE3$b$, a 3b-th active pattern ACT3$b$, a 3b-th source electrode SE3$b$, and a 3b-th drain electrode DE3$b$. Hereinafter, the 3a-th gate electrode GE3$a$ and the 3b-th gate electrode GE3$b$ are referred to as a "third gate electrode GE3", the 3a-th active pattern ACT3$a$ and the 3b-th active pattern ACT3$b$ are referred to as a "third active pattern ACT3", the 3a-th source electrode SE3$a$ and the 3b-th source electrode SE3$b$ are referred to as a "third source electrode SE3", and the 3a-th drain electrode DE3$a$ and the 3b-th drain electrode DE3$b$ are referred to as a "third drain electrode DE3".

The third gate electrode GE3 may be connected to the ith scan line Si. The third gate electrode GE3 may be provided as a portion of the ith scan line Si, or protrude from the ith scan line Si. For example, the 3a-th gate electrode GE3$a$ may protrude from the ith scan line Si, and the 3b-th gate electrode GE3$b$ may be provided as a portion of the ith scan line Si.

Each of the third active pattern ACT3, the third source electrode SE3 and the third drain electrode DE3 may include a semiconductor layer doped or undoped with impurities. For example, each of the third source electrode SE3 and the third drain electrode DE3 may include a semiconductor layer doped with impurities and the third active pattern ACT3 may include a semiconductor layer undoped with impurities. The third active pattern ACT3 may correspond to an overlapping portion between the third source and drain electrodes SE3 and DE3 and the third gate electrode GE3. One end of the third source electrode SE3 may be connected to the third active pattern ACT3 and the other end thereof may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. In addition, the third drain electrode DE3 may be connected to the first gate electrode GE1 of the first transistor T1 through the connection line CNL, the second contact hole CH2 and the first contact hole CH1.

The fourth transistor T4 may have a dual gate structure to prevent current leakage. In other words, the fourth transistor T4 may include a 4a-th transistor and a 4b-th transistor. The 4a-th transistor T4 may include a 4a-th gate electrode GE4$a$, a 4a-th active pattern ACT4$a$, a 4a-th source electrode SE4$a$, and a 4a-th drain electrode DE4$a$. The 4b-th transistor may include a 4b-th gate electrode GE4$b$, a 4b-th active pattern ACT4$b$, a 4b-th source electrode SE4$b$, and a 4b-th drain electrode DE4$b$. Hereinafter, the 4a-th gate electrode GE4$a$ and the 4b-th gate electrode GE4$b$ are referred to as a "fourth gate electrode GE4", the 4a-th active pattern ACT4$a$ and the 4b-th active pattern ACT4$b$ are referred to as a "fourth active pattern ACT4", the 4a-th source electrode SE4$a$ and the 4b-th source electrode SE4$b$ are referred to as a "fourth source electrode SE4", and the 4a-th drain electrode DE4$a$ and the 4b-th drain electrode DE4$b$ are referred to as a "fourth drain electrode DE4".

The fourth gate electrode GE4 may be connected to the (i−1)th scan line Si−1. The fourth gate electrode GE4 may be provided as a portion of the (i−1)th scan line Si−1, or may protrude from the (i−1)th scan line Si−1. For example, the 4a-th gate electrode GE4a may be provided as a portion of the (i−1)th scan line Si−1. The 4b-th gate electrode GE4b may extend from the (i−1)th scan line Si−1.

Each of the fourth active pattern ACT4, each of the fourth source electrode SE4 and the fourth drain electrode DE4 may include a semiconductor layer doped or undoped with impurities. For example, each of the fourth source electrode SE4 and the fourth drain electrode DE4 may include a semiconductor layer doped with impurities and the fourth active pattern ACT4 may include a semiconductor layer undoped with impurities. The fourth active pattern ACT4 may correspond to an overlapping portion between the fourth source and drain electrodes SE4 and DE4 and the fourth gate electrode GE4.

One end of the fourth source electrode SE4 may be connected to the fourth active pattern ACT4 and the other end of the fourth source electrode SE4 may be connected to the initialization power supply line IPL of the pixel PXL in the (i−1)th row and a seventh drain electrode DE7 of the seventh transistor T7 in the pixel PXL in the (i−1)th row. An auxiliary connection line AUX may be provided between the fourth source electrode SE4 and the initialization power supply line IPL. One end of the auxiliary connection line AUX may be connected to the fourth source electrode SE4 through a ninth contact hole CH9. The other end of the auxiliary connection line AUX may be connected to the initialization power supply line IPL in the (i−1)th row through an eighth contact hole CH8 of the pixel PXL in the (i−1)th row. One end of the fourth drain electrode DE4 may be connected to the fourth active pattern ACT4. The other end of the fourth drain electrode DE4 may be connected to the third drain electrode DE3 of the third transistor T3. The fourth drain electrode DE4 may be connected to the first gate electrode GE1 of the first transistor T1 through the connection line CNL, the second contact hole CH2 and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the emission control line Ei. The fifth gate electrode GE5 may be provided as a portion of the emission control line Ei and protrude from the emission control line Ei. Each of the fifth active pattern ACT5, the fifth source electrode SE5 and the fifth drain electrode DE5 may be a semiconductor layer doped or undoped with impurities. For example, each of the fifth source electrode SE5 and the fifth drain electrode DE5 may include a semiconductor layer doped with impurities and the fifth active pattern ACT5 may include a semiconductor layer undoped with impurities. The fifth active pattern ACT5 may correspond to an overlapping portion between the fifth source and drain electrodes SE5 and DE5 and the fifth gate electrode GE5. One end of the fifth source electrode SE5 may be connected to the fifth active pattern ACT5. The other end of the fifth source electrode SE5 may be connected to the power supply line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the emission control line Ei. The sixth gate electrode GE6 may be provided as the emission control line Ei or protrude from the emission control line Ei. Each of the sixth active pattern ACT6, the sixth source electrode SE6 and the sixth drain electrode DE6 may include a semiconductor layer doped or undoped with impurities. For example, each of the sixth source electrode SE6 and the sixth drain electrode DE6 may include a semiconductor layer doped with impurities and the sixth active pattern ACT6 may include a semiconductor layer undoped with impurities. The sixth active pattern ACT6 may correspond to an overlapping portion between the sixth source and drain electrodes SE6 and DE6 and the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and the seventh drain electrode DE7.

The seventh gate electrode GE7 may be connected to the ith scan line Si. The seventh gate electrode GE7 may be provided as a portion of the ith scan line Si or extend from the ith scan line Si. Each of the seventh active pattern ACT7, the seventh source electrode SE7 and the seventh drain electrode DE7 may include a semiconductor layer doped or undoped with impurities. For example, each of the seventh source electrode SE7 and the seventh drain electrode DE7 may include a semiconductor layer doped with impurities and the seventh active pattern ACT7 may include a semiconductor layer undoped with impurities. The seventh active pattern ACT7 may correspond to an overlapping portion between the seventh source and drain electrodes SE7 and DE7 and the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power supply line IPL. In addition, the seventh drain electrode DE7 may be connected to the fourth source electrode SE4 of the fourth transistor T4 of the pixel PXL in the (i+1)th row. The seventh drain electrode DE7 and the fourth source electrode SE4 of the fourth transistor T4 of the pixel PXL in the (i+1)th row may be connected through the auxiliary connection line AUX, the eighth contact hole CH8, and the ninth contact hole CH9.

The storage capacitor Cst may include a lower electrode LE and an upper electrode UE. The lower electrode LE may include the first gate electrode GE1 of the first transistor T1.

The upper electrode UE may overlap with the first gate electrode GE1 and cover the lower electrode LE in a plan view. The capacitance of the storage capacitor Cst may be increased by increasing an overlapping area between the upper electrode UE and the lower electrode LE. The upper electrode UE may extend in the first direction DR1. According to an embodiment, a voltage having the same voltage level as the first power supply ELVDD may be applied to the upper electrode UE. The upper electrode UE may be opened by removing a portion of a region where the first contact hole CH1 in contact with the first gate electrode GE1 and the connection line CNL is formed.

The display element OLED may include a first electrode AD, a second electrode CD, and an emitting layer EML provided between the first electrode AD and the second electrode CD.

The first electrode AD may be provided in an emission area corresponding to each pixel PXL. The first electrode AD may be connected to the seventh source electrode SE7 of the seventh transistor T7 and the sixth drain electrode DE6 of the sixth transistor T6 through the seventh contact hole CH7 and a tenth contact hole CH10, respectively. The first bridge pattern BRP1 may be provided between the seventh contact hole CH7 and the tenth contact hole CH10. A second bridge pattern BRP2 may be provided between the tenth contact hole CH10 and a twelfth contact hole CH12. The first bridge pattern BRP1 and the second bridge pattern BRP2 may connect the sixth drain electrode DE6, the seventh source electrode SE7 and the first electrode AD.

Hereinafter, the structure of the display element OLED according to an embodiment is described according to a stacking order with reference to FIGS. 4 to 6.

The first to seventh active patterns ACT1 to ACT7 may be provided on the substrate SUB. The first to seventh active patterns ACT1 to ACT7 may include a semiconductor material.

A buffer layer BUL may be provided between the substrate SUB and the first to seventh active patterns ACT1 to ACT7. The buffer layer BUL may prevent impurities from being diffused from the substrate SUB into the first to seventh active patterns ACT1 to ACT7. The buffer layer BUL may be formed in a single layer. However, the buffer layer BUL may have a multilayer structure including at least two layers. The buffer layer BUL may include at least one of an organic insulating layer and an inorganic insulating layer. The organic insulating layer may include an organic insulating material capable of transmitting light. The inorganic insulating layer may include at least one of silicon oxide, silicon nitride and silicon oxynitride. When the buffer layer BUL has a multilayer structure, the respective layers may include the same or different materials from each other. For example, the inorganic insulating layer may include a first layer including a silicon oxide and a second layer provided on the first layer and including a silicon nitride.

A gate insulating layer GI may be provided over the substrate SUB on which the first to seventh active patterns ACT1 to ACT7 are formed. The gate insulating layer GI may include at least one of an organic insulating layer and an inorganic insulating layer. The organic insulating layer may include an organic insulating material capable of transmitting light. For example, the organic insulating layer may include at least one of photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin. The inorganic insulating layer may include at least one of silicon oxide, silicon nitride and silicon oxynitride.

The (i−1)th scan line Si−1, the ith scan line Si, the emission control line Ei, and the first to seventh gate electrodes GE1 to GE7 may be provided on the gate insulating layer GI. The first gate electrode GE1 may be the lower electrode LE of the storage capacitor Cst. The second gate electrode GE2 and the third gate electrode GE3 may be formed integrally with the ith scan line Si. The fourth gate electrode GE4 may be formed integrally with the (i−1)th scan line Si−1. The fifth gate electrode GE5 and the sixth gate electrode GE6 may be formed integrally with the emission control line Ei. The seventh gate electrode GE7 may be formed integrally with the ith scan line Si.

Each of the (i−1)th scan line Si−1, the ith scan line Si, the emission control line Ei, and the first to seventh gate electrodes GE1 to GE7 may include a metallic material. For example, the (i−1)th scan line Si−1, the ith scan line Si, the emission control line Ei, and the first to seventh gate electrodes GE1 to GE7 may include at least one of gold (Au), silver (Ag), aluminum (Al), molybdenum (Mo), chromium (Cr), titanium (Ti), nickel (Ni), neodymium (Nd), copper (Cu), and an alloy thereof. Each of the (i−1)th scan line Si−1, the ith scan line Si, the emission control line Ei, and the first to seventh gate electrodes GE1 to GE7 may be formed in a single layer. However, the inventive concept is not limited thereto. For example, each of the (i−1)th scan line Si−1, the ith scan line Si, the emission control line Ei, and the first to seventh gate electrodes GE1 to GE7 may have a multilayer structure of two or more layers including at least one of gold (Au), silver (Ag), aluminum (Al), molybdenum (Mo), chromium (Cr), titanium (Ti), nickel (Ni), neodymium (Nd), copper (Cu), and an alloy thereof.

A first interlayer insulating layer IL1 may be provided over the substrate SUB on which the (i−1)th scan line Si−1 is formed. The first interlayer insulating layer IL1 may include at least one of polysiloxane, silicon oxide, silicon nitride and silicon oxynitride.

The upper electrode UE of the storage capacitor Cst and the initialization power supply line IPL may be provided on the first interlayer insulating layer IL1. The upper electrode UE may overlap the lower electrode LE. The upper electrode UE and the lower electrode LE may form the storage capacitor Cst with the first interlayer insulating layer IL1 interposed therebetween. Each of the upper electrode UE and the initialization power supply line IPL may include gold (Au), silver (Ag), aluminum (Al), molybdenum (Mo), chromium (Cr), titanium (Ti), nickel (Ni), neodymium (Nd), copper (Cu), and an alloy thereof. Each of the upper electrode UE and the initialization power supply line IPL may be formed in a single layer. However, the inventive concept is not limited thereto. For example, each of the upper electrode UE and the initialization power supply line IPL may have a multilayer structure of two or more layers including at least one of gold (Au), silver (Ag), aluminum (Al), molybdenum (Mo), chromium (Cr), titanium (Ti), nickel (Ni), neodymium (Nd), copper (Cu), and an alloy thereof.

A second interlayer insulating layer IL2 may be provided over the substrate SUB where the upper electrode UE and the initialization power supply line IPL are arranged.

The second interlayer insulating layer IL2 may include at least one of an inorganic insulating layer and an organic insulating layer. For example, the second interlayer insulating layer IL2 may include at least one inorganic insulating layer. The inorganic insulating layer may include at least one of silicon oxide, silicon nitride and silicon oxynitride. In addition, the second interlayer insulating layer IL2 may include at least one organic insulating layer. The organic insulating layer may include photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin. In addition, the second interlayer insulating layer IL2 may have a multilayer structure including at least one inorganic insulating layer and at least one organic insulating layer.

First conductive patterns may be provided on the second interlayer insulating layer IL2. The first conductive patterns may include the data line Dj, the connection line CNL, the auxiliary connection line AUX, the first bridge pattern BRP1, and the power supply line PL.

The data line Dj may be connected to the second source electrode SE2 through the sixth contact hole CH6 passing through the first interlayer insulating layer IL1, the second interlayer insulating layer IL2, and the gate insulating layer GI.

The connection line CNL may be connected to the first gate electrode GE1 through the first contact hole CH1 passing through the first interlayer insulating layer IL1 and the second interlayer insulating layer IL2. In addition, the connection line CNL may be connected to the third drain electrode DE3 and the fourth drain electrode DE4 through the second contact hole CH2 passing through the gate insulating layer GI, the first interlayer insulating layer IL1 and the second interlayer insulating layer IL2.

The auxiliary connection line AUX may be connected to the initialization power supply line IPL through the eighth contact hole CH8 passing through the second interlayer insulating layer IL2. In addition, the auxiliary connection line AUX may be connected to the fourth source electrode SE4 and the seventh drain electrode DE7 of the pixel PXL in the (i−1)th row through the ninth contact hole CH9 passing through the gate insulating layer GI, the first interlayer insulating layer IL1, and the second interlayer insulating layer IL2.

The first bridge pattern BRP1 may be provided between the sixth drain electrode DE6 and the first electrode AD and serve as a medium for connecting the sixth drain electrode DE6 and the first electrode AD to each other. The first bridge pattern BRP1 may be connected to the sixth drain electrode DE6 and the first source electrode SE1 through the seventh contact hole CH7 passing through the gate insulating layer GI, the first interlayer insulating layer IL1, and the second interlayer insulating layer IL2.

A third interlayer insulating layer IL3 may be provided over the substrate SUB on which the first conductive patterns are provided. The third interlayer insulating layer IL3 may include a first insulating layer IL31 and a second insulating layer IL32 provided on the first insulating layer IL31.

The first insulating layer IL31 may include an inorganic insulating material. For example, the first insulating layer IL31 may include at least one of polysiloxane, silicon oxide, silicon nitride and silicon oxynitride.

The second interlayer insulating layer IL2 may include an inorganic insulating material. For example, the second interlayer insulating layer IL2 may include at least one inorganic insulating layer. The inorganic insulating material may include at least one of silicon oxide, silicon nitride and silicon oxynitride. In addition, the second insulating layer IL32 may include an organic insulating material. For example, the second insulating layer IL32 may include at least one of photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin. In addition, the second interlayer insulating layer IL2 may have a multilayer structure including at least one inorganic insulating layer and at least one organic insulating layer.

Second conductive patterns may be provided on the third interlayer insulating layer IL3. The second conductive patterns may include the power supply line PL and the second bridge pattern BRP2. The second bridge pattern BRP2 may be connected to the first bridge pattern BRP1 through the tenth contact hole CH10 passing through the first insulating layer IL3 and the third interlayer insulating layer IL3.

The power supply line PL may be connected to the upper electrode UE of the storage capacitor Cst through the third and fourth contact holes CH3 and CH4 passing through the second interlayer insulating layer IL2 and the third interlayer insulating layer IL3. The power supply line PL may be connected to the fifth source electrode SE5 through the fifth contact hole CH5 passing through the first interlayer insulating layer IL1, the second interlayer insulating layer IL2, the third interlayer insulating layer IL3, and the gate insulating layer GI.

A fourth interlayer insulating layer IL4 may be provided on the third interlayer insulating layer IL3 on which the second conductive patterns are provided.

The fourth interlayer insulating layer IL4 may include an organic insulating material. For example, the fourth interlayer insulating layer IL4 may include at least one of photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

The display element OLED may be provided on the fourth interlayer insulating layer IL4. The display element OLED may include the first electrode AD, the second electrode CD, and the emitting layer EML provided between the first electrode AD and the second electrode CD.

The first electrode AD may be provided on the fourth interlayer insulating layer IL4. The first electrode AD may be connected to the second bridge pattern BRP2 through the twelfth contact hole CH12 passing through the fourth interlayer insulating layer IL4. Therefore, the first electrode AD may be electrically connected to the first bridge pattern BRP1. The first bridge pattern BRP1 may be connected to the sixth drain electrode DE6 and the seventh source electrode SE7 through the seventh contact hole CH7. Therefore, the first electrode AD may be finally connected to the sixth drain electrode DE6 and the seventh source electrode SE7.

A pixel defining layer PDL defining an emission area so as to correspond to each pixel PXL may be provided over the substrate SUB where the first electrode AD is formed. The pixel defining layer PDL may expose an upper surface of the first electrode AD and protrude from the substrate SUB along the circumference of the pixel PXL. However, according to another embodiment, the first electrode AD may be formed over the pixel defining layer PDL.

The emitting layer EML may be provided on the emission area surrounded by the pixel defining layer PDL, and the second electrode CD may be provided on the emitting layer EML. A sealing layer SLM may be provided on the second electrode CD to cover the second electrode CD.

One of the first electrode AD and the second electrode CD may be an anode electrode and the other may be a cathode electrode. For example, the first electrode AD may be an anode electrode, and the second electrode CD may be cathode electrode.

In addition, at least one of the first electrode AD and the second electrode CD may be a transmissive electrode. For example, when the display element OLED is a bottom emission type organic light emitting device, the first electrode AD may be a transmissive electrode and the second electrode CD may be a reflective electrode. When the display element OLED is a top emission type organic light emitting device, the first electrode AD may be a reflective electrode and the second electrode CD may be a transmissive electrode. When the display element OLED is a dual emission type organic light emitting device, both the first electrode AD and the second electrode CD may be transmissive electrodes. According to an embodiment, for example, the display element OLED may be a top emission type organic light emitting device and the first electrode AD may be an anode electrode.

The first electrode AD may include a reflective layer (not illustrated) capable of reflecting light and a transparent conductive layer (not illustrated) provided above or under the reflective layer. At least one of the transparent conductive layer and the reflective layer may be electrically connected to the seventh source electrode SE7.

The reflective layer may include a light reflecting material. For example, the reflective layer may include at least one of aluminum (Al), silver (Ag), chromium (Cr), molybdenum (Mo), platinum (Pt), nickel (Ni) and an alloy thereof.

The transparent conductive layer may include a transparent conductive oxide. For example, the transparent conductive layer may include at least one transparent conductive oxide, among Indium Tin Oxide (ITO), Indium Zinc Oxide (IZO), Aluminum Zinc Oxide (AZO), gallium doped zinc oxide (GZO), zinc tin oxide (ZTO), Gallium tin oxide (GTO) and fluorine doped tin oxide (FTO).

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (P), polyarylether (PAE), heterocyclic polymer, parylene, epoxy, benzocyclobutene (BCB), siloxane based resin and silane based resin.

The emitting layer EML may be arranged on the exposed surface of the first electrode AD. The emitting layer EML may have a multilayer film structure including at least a light generation layer LGL. For example, the emitting layer EML may include a hole injection layer HIL injecting holes, a hole transport layer HTL having excellent hole transportability and increasing recombination between holes and electrons by blocking movements of electrons which fail to be combined in the light generation layer LGL, the light generation layer LGL generating light by recombination of the injected electrons and holes, a hole blocking layer HBL blocking the movements of the holes which fail to be combined in the light generation layer LGL, an electron transport layer ETL smoothly transporting electrons to the light generation layer LGL, and an electron injection layer EIL injecting electrons. In addition, the hole injection layer, the hole transport layer, the hole blocking layer, the electron transport layer, and the hole injection layer included in the emitting layer EML may be common layers that are commonly arranged in neighboring pixels PXL.

Color of light generated from the light generation layer may be one of red, green, blue and white. However, the inventive concept is not limited thereto. For example, the light generation layer may be one of magenta, cyan, and yellow.

The second electrode CD may be a transflective layer. For example, the second electrode CD may be a thin metal layer which is thin enough to transmit light emitted from the emitting layer EML. The second electrode CD may transmit part of the light emitted from the emitting layer EML and reflect the rest of the light emitted from the emitting layer EML.

The second electrode CD may include a material having a lower work function than the transparent conductive layer. For example, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) and an alloy thereof.

Part of the light emitted from the emitting layer EML may not transmit the second electrode CD and light reflected from the second electrode CD may be reflected from the reflective layer again. In other words, the light emitted from the emitting layer EML may resonate between the reflective layer and the second electrode CD. The resonance of the light may contribute to improvement of light extraction efficiency of the display devices OLED.

The distance between the reflective layer and the second electrode CD may vary depending on the color of the light emitted from the emitting layer EML. In other words, the distance between the reflective layer and the second electrode CD may be adjusted to correspond to the resonance distance in accordance with the color of the light emitted from the emitting layer EML.

The sealing layer SLM may prevent intrusion of oxygen and moisture into the display element OLED. The sealing layer SLM may include a plurality of inorganic layers (not illustrated) and a plurality of organic layers (not illustrated). For example, the sealing layer SLM may include a plurality of unit sealing layers consisting of an inorganic layer and an organic layer arranged on the inorganic layer. In addition, an inorganic layer may be arranged on a top portion of the sealing layer SLM. The inorganic layer may include at least one of silicon oxide, silicon nitride, silicon oxynitride, aluminum oxide, titanium oxide, zirconium oxide and tin oxide.

Figure 7A:
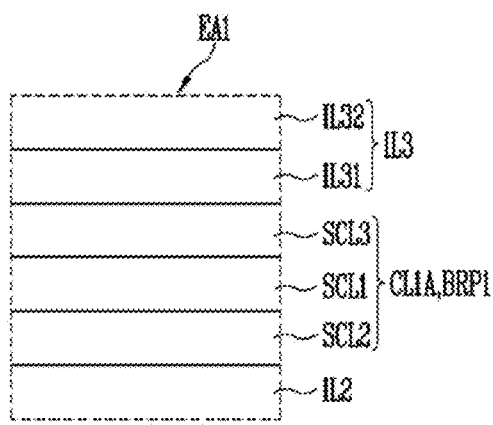
FIGS. 7A and 7B are enlarged views of an area EA1 of FIG. 5.
Figure 7B:
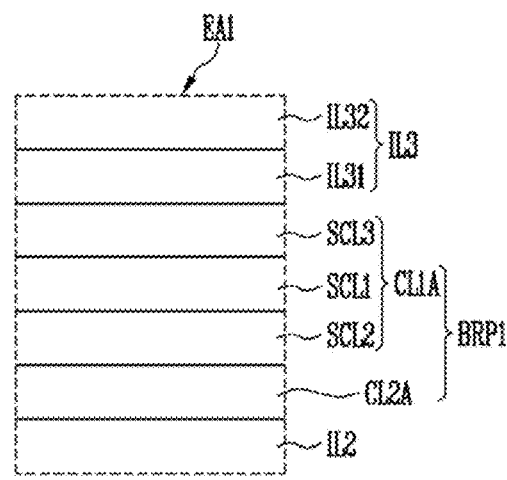
Figure 8:
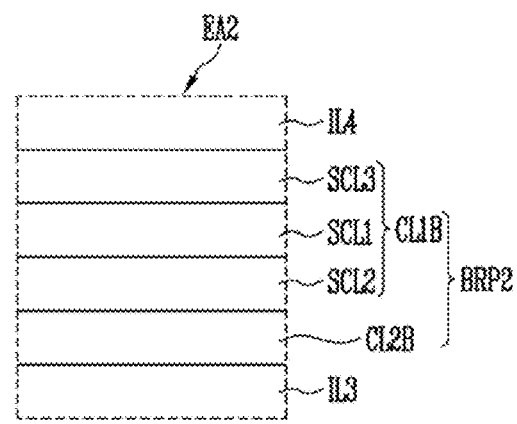
FIG. 8 is an enlarged view of an area EA2 of FIG. 5.
Figure 9:
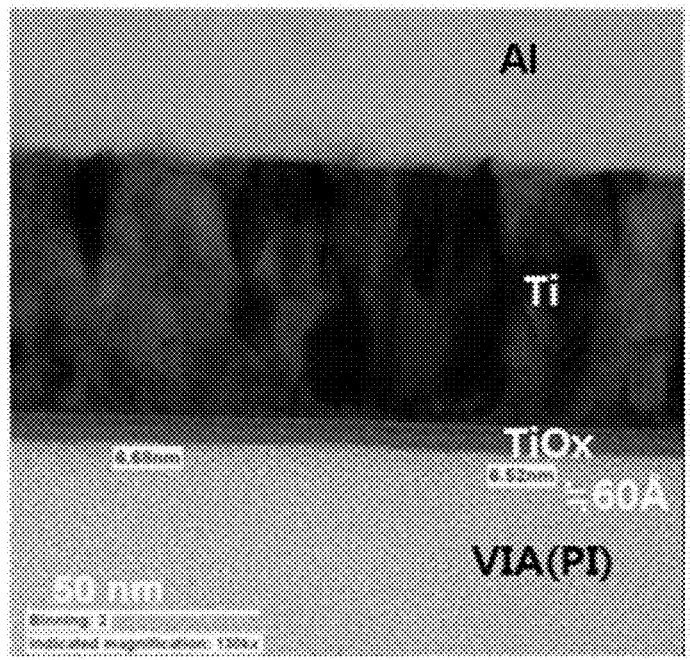
FIGS. 9, 10, 11 and 12 are electron microscopic images showing a conductive pattern formed on an organic layer including polyimide.
Figure 10:
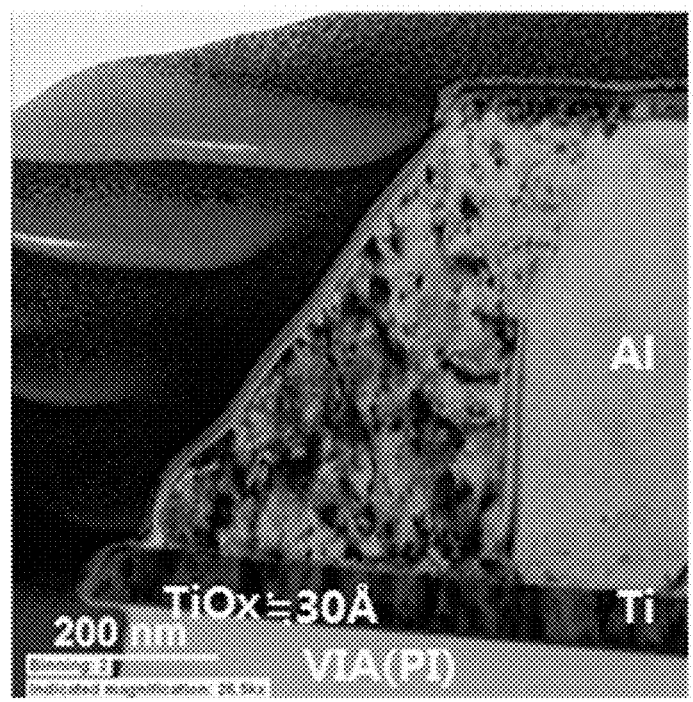
Figure 11:
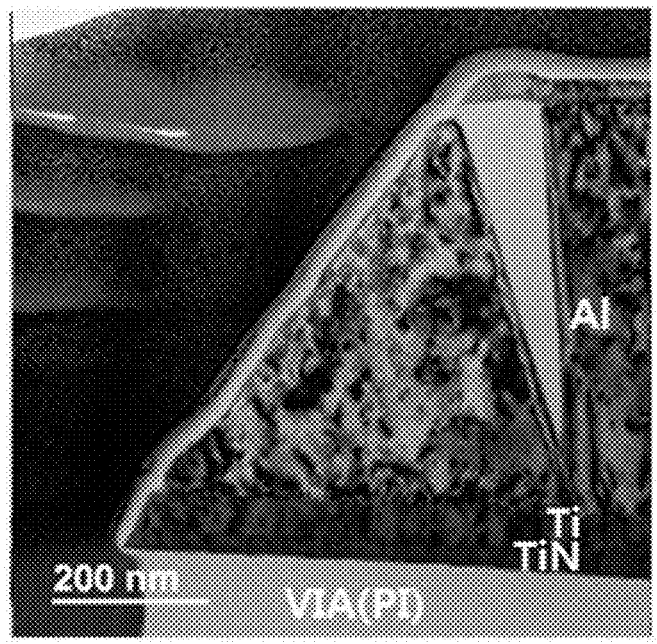
Figure 12:
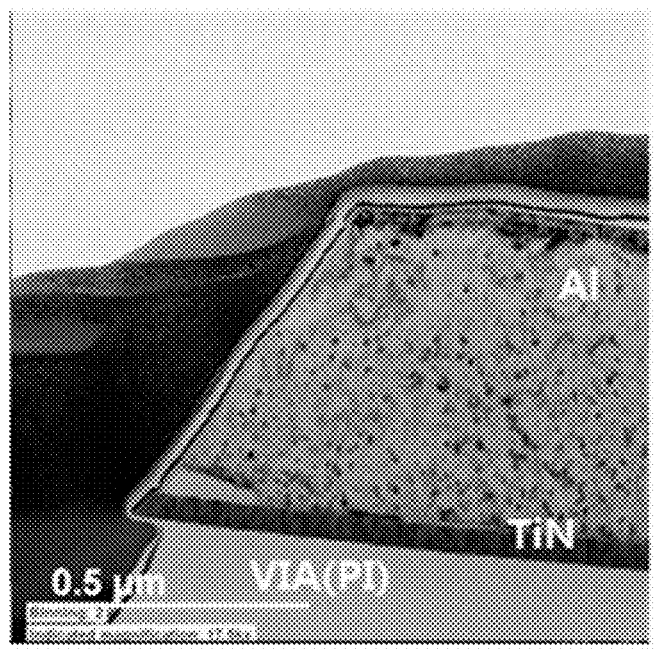
Figure 13:
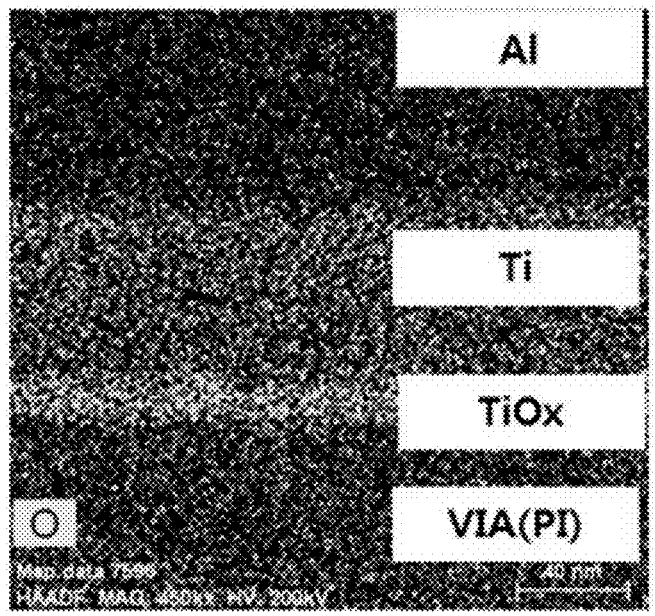
FIGS. 13, 14, 15 and 16 are high-angle annular dark-field (HAADF) images showing a conductive pattern formed on an organic layer including polyimide.
Figure 14:
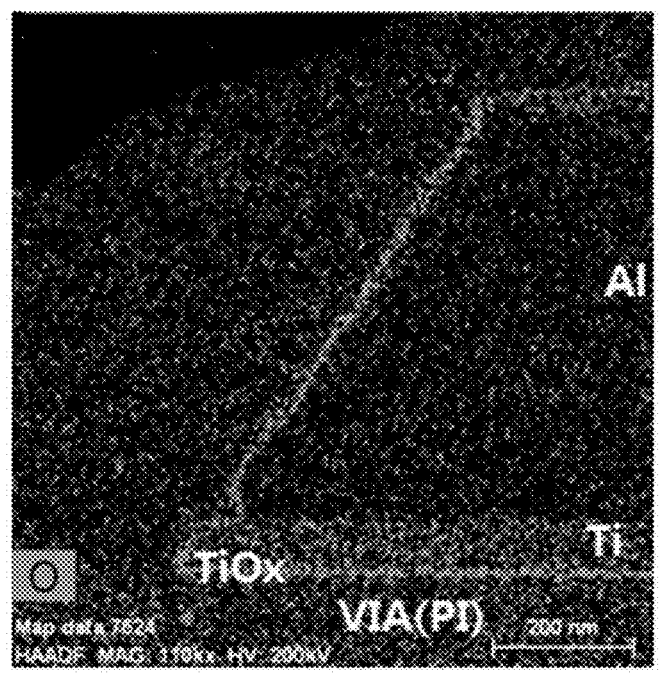
Figure 15:
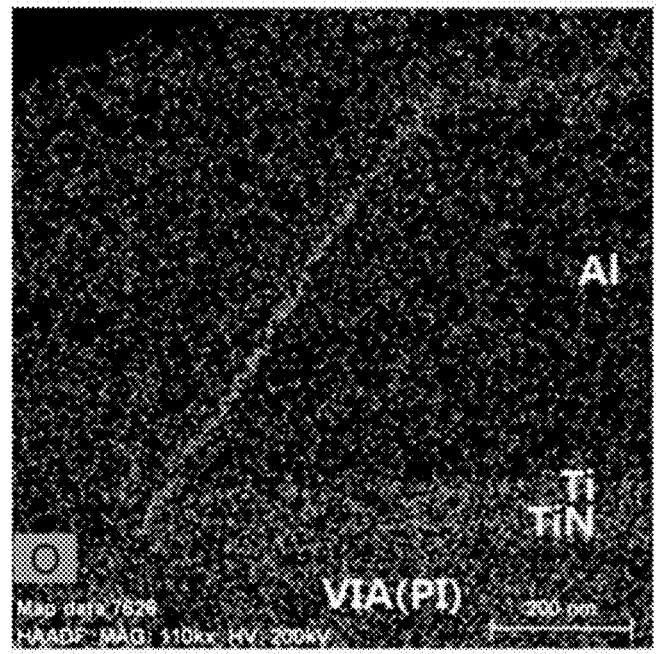
Figure 16:
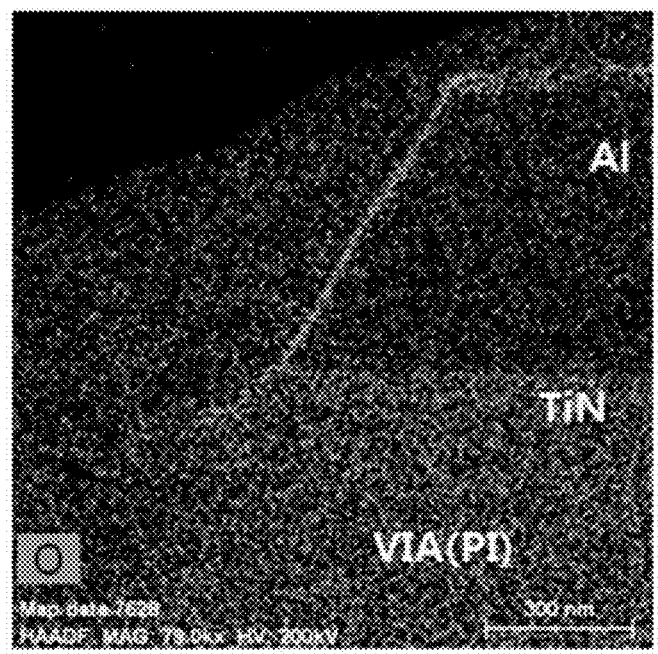

FIGS. 7A and 7B are enlarged views of the area EA1 of FIG. 5. FIGS. 8A and 8B are enlarged views of the area EA2 of FIG. 7. FIGS. 9 to 12 are electron microscopic images showing a conductive pattern formed on an organic layer including polyimide. FIGS. 13 to 16 are high-angle annular dark-field (HAADF) images showing a conductive pattern formed on an organic layer including polyimide. The conductive pattern shown in FIGS. 9, 10, 13 and 14 may include a titanium (Ti) layer and an aluminum (Al) layer sequentially stacked on an insulating layer. The conductive pattern shown in FIGS. 11 and 15 may include a titanium nitride (TIN) layer, a titanium (Ti) layer, and an aluminum (Al) layer sequentially stacked on an insulating layer. The conductive pattern shown in FIGS. 12 and 16 may include a titanium nitride (TiN) layer and an aluminum (Al) layer sequentially stacked on an insulating layer.

Referring to FIGS. 4 to 16, each pixel PXL may include at least one transistor provided on the substrate SUB, the display element OLED connected to the transistor, and the first bridge pattern BRP1 and the second bridge pattern BRP2 connecting the transistor to the display element OLED.

The transistor may be covered by the first interlayer insulating layer IL1 and the second interlayer insulating layer IL2. The first bridge pattern BRP1 connected to the data line Dj, the connection line CNL, and the transistor may be provided on the second interlayer insulating layer IL2. The data line Dj, the connection line CNL, and the first bridge pattern BRP1 may be one of the first conductive patterns provided on the second interlayer insulating layer IL2.

The second interlayer insulating layer IL2 may include an inorganic insulating material. For example, the second interlayer insulating layer IL2 may include at least one inorganic insulating layer. The inorganic insulating material may include at least one of silicon oxide, silicon nitride, silicon oxynitride. In addition, the second insulating layer IL32 may also include an organic insulating material. The organic insulating material may be at least one of polyacrylates resin, epoxy resin, phenolic resin, polyamides resin, polyimides rein, unsaturated polyesters resin, poly-phenylene ethers resin, poly-phenylene sulfides resin, and benzocyclobutenes resin. All the above described-materials included in the organic insulating layer may include carbon and oxygen. In addition, the organic insulating material may further include at least one of oxygen, nitrogen, fluorine, and sulfur.

The first conductive patterns, for example, the first bridge pattern BRP1 may further include a 1A-th conductive layer CL1A. In addition, when the second interlayer insulating layer IL2 includes an organic insulating material, the first conductive patterns may further include a 2A-th conductive layer CL2A provided between the second interlayer insulating layer IL2 and the 1A-th conductive layer CL1A.

The 1A-th conductive layer CL1A may include a first sub-conductive layer SCL1 provided on the second interlayer insulating layer IL2 and a second sub-conductive layer SCL2 provided between the second interlayer insulating layer IL2 and the first sub-conductive layer SCL1.

The first sub-conductive layer SCL1 may include a metallic material having excellent conductivity, flexibility and malleability. For example, the first sub-conductive layer SCL1 may include at least one of gold (Au), silver (Ag), copper (Cu), aluminum (Al) and an alloy thereof.

The second sub-conductive layer SCL2 may include a material which prevents diffusion of the materials included in the first sub-conductive layer SCL1 and oxidation of the first sub-conductive layer SCL1. For example, the second sub-conductive layer SCL2 may include titanium (Ti).

The 1A-th conductive layer CL1A may further include a third sub-conductive layer SCL3 provided on the first sub-conductive layer SCL1. The third sub-conductive layer SCL3 may prevent oxidation of the first sub-conductive layer SCL1. The third sub-conductive layer SCL3 may include the same material as the second sub-conductive layer SCL2, for example, titanium (Ti).

In the first conductive patterns, the 2A-th conductive layer CL2A may correspond to an additional conductive layer provided between the second interlayer insulating layer IL2 and the 1A-th conductive layer CL1A and include a material which does not form an oxide or a composite material by reaction with an organic insulating material. For example, the 2A-th conductive layer CL2A may include a metal nitride. The metal nitride may be a nitride of the material included in the second sub-conductive layer SCL2. For example, the 2A-th conductive layer CL2A may include titanium nitride (TiNx). Therefore, when the second interlayer insulating layer IL2 includes an organic insulating material, the 2A-th conductive layer CL2A may prevent the organic insulating material from being diffused into the 1A-th conductive layer CL1A and reacting with the material included in the 1A-th conductive layer CL1A.

When the second interlayer insulating layer IL2 includes an organic insulating material and the 2A-th conductive layer CL2A is omitted, the 1A-th conductive layer CL1A may be directly provided on the second interlayer insulating layer IL2, and the 1A-th conductive layer CL1A, particularly the second sub-conductive layer SCL2 may contact the second interlayer insulating layer IL2. When the second sub-conductive layer SCL2 contacts the second interlayer insulating layer IL2, the material included in the second sub-conductive layer SCL2 may react with the organic insulating material of the second interlayer insulating layer IL2 to form an oxide of the material included in the second sub-conductive layer SCL2. Alternatively, a composite material including the material contained in the second sub-conductive layer SCL2 and the material contained in the organic insulating material may be generated.

When the 2A-th conductive layer CL2A fails to prevent diffusion of the materials included in the second interlayer insulating layer IL2 and the 1A-th conductive layer CL1A, the materials contained in the 1A-th conductive layer CL1A and the second interlayer insulating layer IL2 may react with each other to form the oxide or the composite material at the interface between the second interlayer insulating layer IL2 and the 2A-th conductive layer CL2A or the interface between the 1A-th conductive layer CL1A and the 2A-th conductive layer CL2A. In addition, when the 2A-th conductive layer CL2A includes a material which reacts with the organic insulating material, the materials included in the 2A-th conductive layer CL2A and the organic insulating layer may react with each other to form the oxide or the composite material during a deposition process of the 2A-th conductive layer CL2A.

The data line Dj of the first conductive patterns may be connected to the second source electrode SE2 of the second transistor T2. The first bridge pattern BRP1 of the first conductive patterns may be connected to the seventh source electrode SE7 of the seventh transistor T7. In addition, the connection line CNL of the first conductive patterns may be connected to the third drain electrode DE3 of the third transistor T3. Each of the third drain electrode DE3 and the seventh source electrode SE7 may include a semiconductor material.

Portions of the data line Dj, the first bridge pattern BRP1 and the connection line CNL which are connected to the second source electrode SE2, the third drain electrode DE3 and the seventh source electrode SE7 may be the 2A-th conductive layer CL2A. The 2A-th conductive layer CL2A may contain 9 atomic percent (at %) to 45 at % of nitrogen so that the 2A-th conductive layer CL2A may be connected to the second source electrode SE2, the third drain electrode DE3 or the seventh source electrode SE7 and maintain conductivity.

In addition, the 2A-th conductive layer CL2A may have a smaller thickness than the first sub-conductive layer SCL1, the second sub-conductive layer SCL2 and the third sub-conductive layer SCL3. For example, the 2A-th conductive layer CL2A may have a thickness ranging from 10 Å to 100 Å.

The first conductive patterns may be covered by the third interlayer insulating layer IL3. The power supply line PL and the second bridge pattern BRP2 may be provided on the third interlayer insulating layer IL3. The second bridge pattern BRP2 may be connected to the first bridge pattern BRP1. The power supply line PL and the second bridge pattern BRP2 may be one of the second conductive patterns provided on the third interlayer insulating layer IL3.

The third interlayer insulating layer IL3 may include the first insulating layer IL31 including an inorganic insulating material and the second insulating layer IL32 provided on the first insulating layer IL31 and including an organic insulating material. The organic insulating material may be at least one of polyacrylates resin, epoxy resin, phenolic resin, polyamides resin, polyimides resin, unsaturated polyesters resin, poly-phenylene ethers resin, poly-phenylene sulfides resin, and benzocyclobutenes resin. Each of the above-described organic insulating materials may include carbon and oxygen. In addition, the organic insulating material may further include at least one of oxygen, nitrogen, fluorine and sulfur.

The second conductive patterns may be provided on the second insulating layer IL32 of the third interlayer insulating layer IL3. The second conductive patterns may have a similar structure to the first conductive patterns. For example, the second conductive patterns may include a 1B-th conductive layer CL1B provided on the second insulating layer IL32 and a 2B-th conductive layer CL2B provided between the third insulating layer IL3 and the 1B-th conductive layer CL1B.

The 1B-th conductive layer CL1B may include the first sub-conductive layer SCL1 provided on the 2B-th conductive layer CL2B and the second sub-conductive layer SCL2 provided between the 2B-th conductive layer CL2B and the first sub-conductive layer SCL1. In addition, the 1B-th conductive layer CL1B may further include the third sub-conductive layer SCL3 provided on the first sub-conductive layer SCL1.

In the second conductive patterns, the 2B-th conductive layer CL2B may be an additional conductive layer provided between the third interlayer insulating layer IL3 and the 1B-th conductive layer CL1B. Like the 2A-th conductive layer CL2A, the 2B-th conductive layer CL2B may include a material which does not produce an oxide or a composite material by reaction with the organic insulating material. For example, the 2B-th conductive layer CL2B may include a metal nitride. The metal nitride may be a nitride of the material included in the second sub-conductive layer SCL2. For example, the 2B-th conductive layer CL2B may include titanium nitride (TiNx). Therefore, the 2B-th conductive layer CL2B may prevent the organic insulating material included in the second insulating layer IL32 from being diffused into the 1B-th conductive layer CL1B and reacting with the material included in the 1B-th conductive layer CL1B.

When the 2B-th conductive layer CL2B is omitted, the 1B-th conductive layer CL1B may be directly provided on the second insulating layer IL32, and the 1B-th conductive layer CL1B, particularly, the second sub-conductive layer SCL2 may contact the second insulating layer IL32. When the second sub-conductive layer SCL2 contacts the second insulating layer IL32, the material included in the second sub-conductive layer SCL2 may react with the material included in the second insulating layer IL32 to produce an oxide of the material included in the second sub-conductive layer SCL2. Alternatively, a composite material including the material included in the second sub-conductive layer SCL2 and a material contained in the organic insulating material may be generated.

When the 2B-th conductive layer CL2B fails to prevent diffusion of the materials included in the second insulating layer IL32 and the 1B-th conductive layer CL1B, the materials included in the 1B-th conductive layer CL1B and the second insulating layer IL32 may react with each other to form the oxide or the composite material at the interface between the second insulating layer IL32 and the 2B-th conductive layer CL2B or the interface between the 1B-th conductive layer CL1B and the 2B-th conductive layer CL2B. In addition, when the 2B-th conductive layer CL2B includes a material reacting with the organic insulating material, the materials included in the 2B-th conductive layer CL2B and the organic insulating layer may react with each other to form the oxide or the composite material during a deposition process of the 2B-th conductive layer CL2B.

The 2B-th conductive layer CL2B of the second bridge pattern BRP2, among the second conductive patterns, may be connected to the first bridge pattern BRP1. The 2B-th conductive layer CL2B of the second bridge pattern BRP2 may contain 9 at % to 55 at % of nitrogen so that the 2B-th conductive layer CL2B of the second bridge pattern BRP2 may be connected to the first bridge pattern BRP1 and maintain conductivity.

In addition, the 2B-th conductive layer CL2B may have a smaller thickness than the first sub-conductive layer SCL1, the second sub-conductive layer SCL2 and the third sub-conductive layer SCL3. For example, the 2B-th conductive layer CL2B may have a thickness ranging from 10 Å to 100 Å.

As illustrated in FIGS. 9, 10, 13 and 14, the oxide or the composite material may be present in the form of a residual layer at the interface between the 1A-th conductive layer CL1A and the organic insulating layer, the second interlayer insulating layer IL2, and the interface between the 1B-th conductive layer CL1B and the organic insulating layer, the third interlayer insulating layer IL3. The residual layer including the oxide or the composite material may not be removed during an etch process for forming the first conductive patterns or the second conductive patterns. During the process of forming the first conductive patterns or the second conductive patterns, the residual layer may not be removed by an etching gas or an etchant for removing the first conductive layer or the second conductive layer. In other words, an additional process for removing the residual layer may be required to remover the residual layer.

However, according to an embodiment, when a metal nitride, the 2A-th conductive layer CL2A and the 2B-th conductive layer CL2B exists between the 1A-th conductive layer CL1A and the second interlayer insulating layer IL2, and between the 1B-th conductive layer CL1B and the third interlayer insulating layer IL3, the metal nitride may prevent inter-diffusion of atoms in the 1A-th conductive layer CL1A and the second interlayer insulating layer IL2, and in the 1B-th conductive layer CL1B and the third interlayer insulating layer IL3 to form an oxide or a composite material. Therefore, as illustrated in FIGS. 1, 12, 15 and 16, the formation of the residual layer including the oxide or the composite material at the interface between 1A-th conductive layer CL1A and the second interlayer insulating layer IL2, and between the 1B-th conductive layer CL1B and the third interlayer insulating layer IL3 may be prevented.

A method of manufacturing the first conductive patterns and the second conductive patterns is described below. Hereinafter, for convenience of explanation, a method of manufacturing the second conductive patterns is described as an example.

First, the second insulating layer IL32 of the third interlayer insulating layer IL3 including the organic insulating material may be formed. The second insulating layer IL32 may be formed by spin coating.

After the second insulating layer IL32 is formed, the 2B-th conductive layer CL2B may be formed on the second insulating layer IL2.

The 2B-th conductive layer CL2B, a diffusion barrier, may include a material which does not react with an organic insulating material and prevents an inter-diffusion of atoms in the second insulating layer IL32 and in the 1B-th conductive layer CL1B. For example, the 2B-th conductive layer CUB may include titanium nitride (TiNx).

The 2B-th conductive layer CL2B may be formed by one of chemical vapor deposition (CVD), atomic layer deposition (ALD) and reactive sputtering deposition. The reactive sputtering deposition may be performed to form titanium nitride (TiNx) using a target including titanium (Ti) and a reaction gas including nitrogen (N2).

After the 2B-th conductive layer CL2B is formed, the 1B-th conductive layer CL1B may be formed on the 2B-th conductive layer CL2B. The 1B-th conductive layer CL1B may include the second sub-conductive layer SCL2, the first sub-conductive layer SCL1 and the third sub-conductive layer SCL3 that are sequentially stacked. The first sub-conductive layer SCL1, the second sub-conductive layer SCL2 and the third sub-conductive layer SCL3 may be formed by a physical deposition method such as sputtering.

The first sub-conductive layer SCL1 may include at least one of gold (Au), silver (Ag), copper (Cu), aluminum (Al) and an alloy thereof. The second sub-conductive layer SCL2 and the third sub-conductive layer SCL3 may include titanium (Ti).

After the 1B-th conductive layer CL1B is formed, the 1B-th conductive layer CL1B and the 2B-th conductive layer CL2B may be etched by photolithography. The second conductive patterns may be formed by etching the 1B-th conductive layer CL1B and the 2B-th conductive layer CL2B. The 1B-th conductive layer CL1B and the 2B-th conductive layer CL2B may be formed at the same time using the same dry etching process.

The first conductive patterns may be formed by the same manufacturing processes as the second conductive patterns, except that the first conductive patterns are formed on the second interlayer insulating layer IL2.

Figure 17:
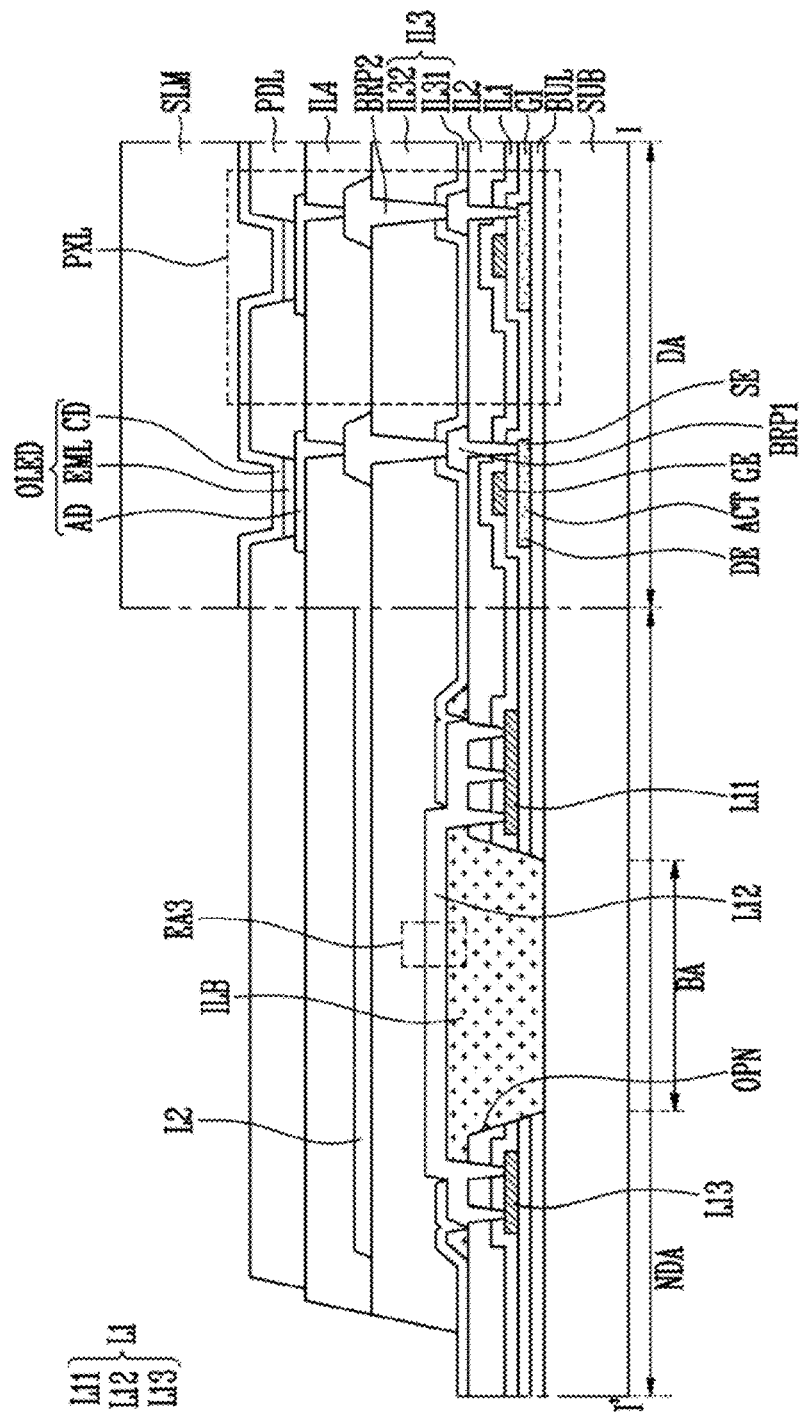
FIG. 17 is a cross-sectional diagram taken along the line I-I' of FIG. 2.
Figure 18:
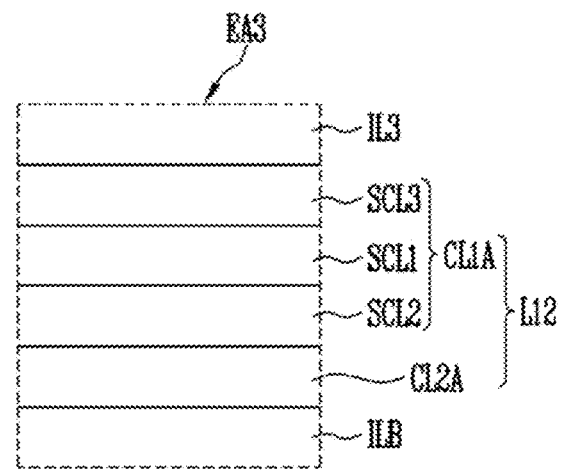
FIG. 18 is an enlarged view of an area EA3 of FIG. 17.

FIG. 17 is a cross-sectional diagram taken along the line I-I' of FIG. 2 for illustrating a display area and a non-display area of a display device. FIG. 18 is an enlarged view of the area EA3 of FIG. 17. For convenience of explanation, as illustrated in FIG. 17, one transistor and one display element may be provided on one pixel.

Referring to FIGS. 1 to 8, 17, and 18, the display device may include the display area DA and the non-display area NDA.

Hereinafter, the display area DA is described first, and the non-display area NDA is then described.

First, in the display area DA, the plurality of pixels PXL may be provided on the substrate SUB. Each of the plurality of pixels PXL may include at least one transistor, the display element OLED connected to the transistor, and the first bridge pattern BRP1 and the second bridge pattern BRP2 connecting the transistor and the display element OLED to each other.

The transistor may be the seventh transistor T7 shown in FIGS. 4 to 6. The transistor may include an active pattern ACT, a gate electrode GE, a source electrode SE and a drain electrode DE.

According to an embodiment, the source electrode SE and the drain electrode DE may extend from both sides of the active pattern ACT. Each of the active pattern ACT, the source electrode SE and the drain electrode DE may include a semiconductor layer doped or undoped with impurities. For example, each of the source electrode SE and the drain electrode DE may include a semiconductor layer doped with impurities and the active pattern ACT may include a semiconductor layer undoped with impurities.

The gate insulating layer GI may be provided between the gate electrode GE and the active pattern ACT, the source electrode SE and the drain electrode DE. The gate insulating layer GI may include at least one of an organic insulating layer and an inorganic insulating layer.

The gate electrode GE may be provided on the gate insulating layer GI. The gate electrode GE may be formed to cover the active pattern ACT.

The buffer layer BUL may be provided between the substrate SUB and the transistor. The buffer layer BUL may include at least one of an organic insulating material and an inorganic insulating material.

The transistor may be covered by the first interlayer insulating layer IL1 and the second interlayer insulating layer IL2 that are sequentially stacked.

The first interlayer insulating layer IL1 may include at least one of polysiloxane, silicon oxide, silicon nitride and silicon oxynitride.

The second interlayer insulating layer IL2 may include at least one of an inorganic insulating layer and an organic insulating layer. For example, the second interlayer insulating layer IL2 may include at least one inorganic insulating layer. The inorganic insulating layer may include at least one of silicon oxide, silicon nitride and silicon oxynitride. In addition, the second interlayer insulating layer IL2 may include at least one organic insulating layer. The organic insulating layer may include at least one of photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin. In addition, the second interlayer insulating layer IL2 may have a multilayer structure including at least one inorganic insulating layer and at least one organic insulating layer.

The first bridge pattern BRP1 connected to the source electrode SE of the transistor may be provided on the second interlayer insulating layer IL2. The first bridge pattern BRP1 may be covered by the third interlayer insulating layer IL3. The third interlayer insulating layer IL3 may include the first insulating layer IL31 and the second insulating layer IL32 provided on first insulating layer IL31. The first insulating layer IL31 may include an inorganic insulating material. The second insulating layer IL32 may include an organic insulating material.

The second bridge pattern BRP2 connected to the first bridge pattern BRP1 may be provided on the third interlayer insulating layer IL3. The second bridge pattern BRP2 may be covered by the fourth interlayer insulating layer IL4. The fourth interlayer insulating layer IL4 may include the same organic insulating material as the third interlayer insulating layer L3.

The display element OLED connected to the second bridge pattern BRP2 may be provided on the fourth interlayer insulating layer IL4. The display element OLED may include the first electrode AD provided on the fourth interlayer insulating layer IL4, the second electrode CD provided on the first electrode AD to overlap the first electrode AD, and the emitting layer EML disposed between the first electrode AD and the second electrode CD.

The sealing layer SLM may be provided on the second electrode CD. The sealing layer SLM may prevent intrusion of oxygen and moisture into the display element OLED. The sealing layer SLM may include a plurality of inorganic layers (not illustrated) and a plurality of organic layers (not illustrated).

Subsequently, the non-display area NDA is described below. Hereinafter, the non-display area NDA will be briefly described to avoid redundant description, or a detailed description thereof will be omitted.

The wiring lines LP may be provided on the non-display area NDA. The bent area BA may be provided at a portion of the non-display area NDA, so that the substrate SUB may be folded or bent.

The wiring lines LP may connect the driver and the pixels PXL. The wiring lines LP may include a first wiring line L1 and a second wiring line L2.

Each of the first wiring line L1 and the second wiring line L2 may be one of the scan lines Si−1 and Si, the data line Dj, the initialization line IPL and the power supply line PL. According to an embodiment, the first wiring line L1 may be the data line Dj and the second wiring line L2 may be the power supply line PL.

The first wiring line L1 may include a plurality of sub-wiring lines. For example, the first wiring line L1 may include first, second and third sub-wiring lines L11, L12 and L13. Each of the first sub-wiring lines L11 may be connected to each of the second sub-wiring lines L12. Each of the second sub-wiring lines L12 may be connected to each of the third sub-wiring lines L13. For convenience of explanation, in FIG. 17, some of the first to third sub-wiring lines L11 to L13 are schematically illustrated. The first sub-wiring line L11 may be connected to the driver, and the third sub-wiring line L13 may be connected to the pixel PXL.

In addition, the first sub-wiring lines L11 and the third sub-wiring lines L13 may be provided on the gate insulating layer GI. The first sub-wiring lines L11 may be provided on the first flat area FA1 and the third sub-wiring lines L13 may be provided on the second flat area FA2. The first sub-wiring lines L11 and the third sub-wiring lines L13 may be formed using the same material as the gate electrode GE by the same process performed to form the gate electrode GE.

In the non-display area NDA, the buffer layer BUL, the gate insulating layer GI, the first interlayer insulating layer IL1, and the second interlayer insulating layer IL2 may be sequentially stacked on the substrate SUB. The buffer layer BUL, the gate insulating layer GI, the first interlayer insulating layer IL1, and the second interlayer insulating layer IL2 may have an opening OPN in the bent area BA. The opening OPN may be formed by removing the buffer layer BUL, the gate insulating layer GI, the first interlayer insulating layer IL1, and the second interlayer insulating layer IL2 on the bent area BA. According to an embodiment, portions of the buffer layer BUL, the gate insulating layer GI, the first interlayer insulating layer IL1, and the second interlayer insulating layer IL2 which correspond to the bent area BA may not be removed.

When the opening OPN corresponds to the bent area BA, it may mean that the opening OPN may overlap with the bent area BA. The opening OPN may have a greater width than the bent area BA. According to an embodiment, for convenience of explanation, the opening OPN may have the same width as the bent area BA as illustrated in FIG. 17. However, the width of the opening OPN may have a greater width than the bent area BA.

As illustrated in 17, inner side surfaces of the buffer layer BUL, the gate insulating layer GI, the first interlayer insulating layer IL1, and the second interlayer insulating layer IL2 may coincide with each other and be arranged in a straight line. However, the inventive concept is not limited thereto. For example, the portion removed from the buffer layer BUL may have a smaller area than the portion removed from the second interlayer insulating layer IL2. According to an embodiment, the portion removed from the buffer layer BUL may be defined as having a smaller area than those of the gate insulating layer GI, the first interlayer insulating layer IL1, and the second interlayer insulating layer IL2.

A bent insulating layer ILB may be provided in the opening OPN. The bent insulating layer ILB may fill at least a portion of the opening OPN. According to an embodiment, the bent insulating layer ILB may completely fill the opening OPN. In addition, according to an embodiment, the bent insulating layer ILB may fill the opening OPN and at the same time cover an area adjacent to the opening OPN, for example, a portion of the upper part of the second interlayer insulating layer IL2 corresponding to the first and/or second flat areas FA1 and/or FA2.

The bent insulating layer ILB may be an organic insulating layer including an organic material. For example, the bent insulating layer ILB may include at least one of photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

When the second interlayer insulating layer IL2 includes the organic insulating material, the bent insulating layer ILB may be omitted. More specifically, the opening OPN may be formed by removing portions of the buffer layer BUL, the gate insulating layer GI and the first interlayer insulating layer IL1 corresponding to the bent area BA. The opening OPN may be filled with the second interlayer insulating layer IL2. Therefore, the second interlayer insulating layer IL2 may replace the bent insulating layer ILB in the opening OPN.

The second sub-wiring line L12 may be provided on the second interlayer insulating layer IL2 and the bent insulating layer ILB. The second sub-wiring line L12 may extend from the first flat area FA1 via the bent area BA to the second flat area FA2 and be provided on the bent insulating layer ILB. The second sub-wiring line L12 may be provided on the second interlayer insulating layer IL2 at a position where the bent insulating layer ILB is not provided.

The second sub-wiring line L12 may be formed using the same material as the first bridge pattern BRP1 by the same process performed to form the first bridge pattern BRP1. In other words, the second sub-wiring line L12 may be one of the first conductive patterns. Therefore, the second sub-wiring line L12 may include the 1A-th conductive layer CL1A provided on the bent insulating layer ILB and the 2A-th conductive layer CL2A provided between the bent insulating layer ILB and the 1A-th conductive layer CL1A.

As illustrated in FIG. 17, the display device may not be bent. However, the display device may be bent at the bent area BA. After a display device according to an embodiment may be manufactured to be flat, the display device may then be bent.

According to an embodiment, for convenience of explanation, the bent area BA is illustrated as coinciding with the portions removed from the buffer layer BUL, the gate insulating layer GI and the first interlayer insulating layer IL1 including the inorganic insulating material. However, the bent area BA may not coincide with the portions removed from the buffer layer BUL, the gate insulating layer GI and the first interlayer insulating layer IL1. For example, although the bent area BA generally corresponds to the portions removed from the buffer layer BUL, the gate insulating layer GI and the first interlayer insulating layer IL1, the bent area BA may be partially wider or narrower than the portions removed from the buffer layer BUL, the gate insulating layer GI and the first interlayer insulating layer IL1 if necessary. In addition, according to an embodiment, it is illustrated that the bent area BA is located only in the non-display area NDA. However, the inventive concept is not limited thereto. For example, the bent area BA may be provided across the non-display area NDA and the display area DA, or in the display area DA.

The third interlayer insulating layer IL3 may be provided on the substrate SUB where the second sub-wiring line L12 is formed. The third interlayer insulating layer IL3 may include the first insulating layer IL31 including an inorganic insulating material and the second insulating layer IL32 provided on the first insulating layer IL1 and including an organic insulating material. Since the first insulating layer IL31 includes the inorganic insulating material, the first insulating layer IL31 may not be provided at positions corresponding to the bent area BA, such as the buffer layer BUL, the gate insulating layer GI and the first interlayer insulating layer IL1.

The second wiring line L2 may be provided on the second insulating layer IL32 of the third interlayer insulating layer IL3. The second wiring line L2 may be formed using the same material as the second bridge pattern BRP2 by the same process as the second bridge pattern BRP2. In other words, the second wiring line L2 may be one of the second conductive patterns. Therefore, the second wiring line L2 may include the 1B-th conductive layer CL1B provided on the second insulating layer IL32 and the 2B-th conductive layer CL2B provided between the second insulating layer IL32 and the 1B-th conductive layer CL1B.

The 1A-th conductive layer CL1A and the 1B-th conductive layer CL1B may include the first sub-conductive layer SCL1 provided on the 2A-th conductive layer CL2A and the 2B-th conductive layer CL2B, and the second sub-conductive layer SCL2 provided between the 2A-th conductive layer CL2A and the first sub-conductive layer SCL1 or between the 2B-th conductive layer CL2B and the first sub-conductive layer SCL1.

The first sub-conductive layer SCL1 may include a metallic material having excellent conductivity, flexibility and malleability. For example, the first sub-conductive layer SCL1 may include at least one of gold (Au), silver (Ag), copper (Cu), aluminum (Al) and an alloy thereof.

The second sub-conductive layer SCL2 may include a material which prevents diffusion of the materials included in the first sub-conductive layer SCL1 and oxidation of the first sub-conductive layer SCL1. For example, the second sub-conductive layer SCL2 may include titanium (Ti).

The 1A-th conductive layer CL1A and the 1B-th conductive layer CL1B may include the third sub-conductive layer SCL3 provided on the first sub-conductive layer SCL1. The third sub-conductive layer SCL3 may prevent oxidation of the first sub-conductive layer SCL1. For example, the third sub-conductive layer SCL3 may include titanium (Ti).

The 2A-th conductive layer CL2A may prevent the material included in the bent insulating layer ILB from being diffused into the 1A-th conductive layer CL1A and the material included in the 2A-th conductive layer CL2A from being diffused into the bent insulating layer ILB. The 2B-th conductive layer CL2B may prevent the material included in the second insulating layer IL32 from being diffused into the 1B-th conductive layer CL1BA and the material included in the 1B-th conductive layer CL1B from being diffused into the second insulating layer IL32. In addition, the 2A-th conductive layer CL2A and the 2B-th conductive layer CL2B may include a material which does not produce an oxide or a composite material by reaction with the organic insulating material. For example, the 2A-th conductive layer CL2A and the 2B-th conductive layer CL2B may include a metal nitride. The metal nitride may be a nitride of the material included in the second sub-conductive layer SCL2. For example, the 2A-th conductive layer CL2A and the 2B-th conductive layer CL2B may include titanium nitride (TiNx).

The fourth interlayer insulating layer IL4 may be provided on the second wiring line L2. An insulating layer including the same material as the pixel defining layer PDL may be provided on the fourth interlayer insulating layer IL4.

FIGS. 19 to 23 are cross-sectional diagrams illustrating conductive patterns of a display device according to an embodiment.

Referring to FIGS. 1 to 8 and 17 to 23, at least some of the conductive patterns CP applied to the display device may be provided on a lower insulating layer LIL and covered by an upper insulating layer UIL.

The lower insulating layer LIL and the upper insulating layer UIL may include an organic insulating material. For example, each of the lower insulating layer LIL and the upper insulating layer UIL may include at least one of photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

In addition, the lower insulating layer LIL may include an inorganic insulating material. For example, the lower insulating layer LIL may include at least one of silicon oxide, silicon nitride and silicon oxynitride.

The lower insulating layer LIL according to an embodiment may be one of the second interlayer insulating layer IL2, the third interlayer insulating layer IL3 and the bent insulating layer ILB as shown in FIGS. 5, 6 and 17. According to an embodiment, the upper insulating layer UIL may be one of the third interlayer insulating layer IL3 and the fourth interlayer insulating layer IL4 as shown in FIGS. 5, 6 and 17.

Figure 19:
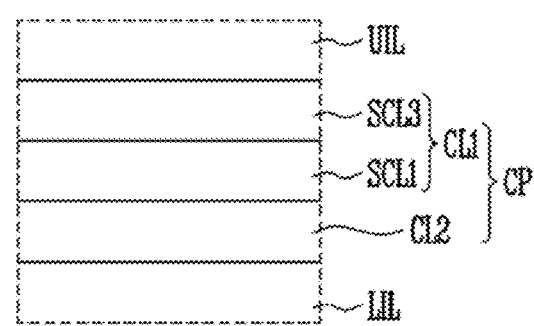
FIGS. 19, 20, 21, 22 and 23 are cross-sectional diagrams illustrating conductive patterns of a display device according to an embodiment of the present inventive concept.

The conductive patterns CP may have various stacked structures. For example, as illustrated in FIGS. 18 and 19, the conductive patterns CP may include the first conductive layer CL1 provided on the lower insulating layer LIL and the second conductive layer CL2 provided between the lower insulating layer LIL and the first conductive layer CL1.

Figure 20:
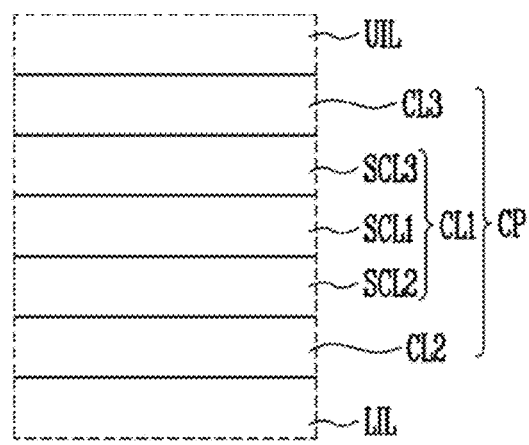
Figure 22:
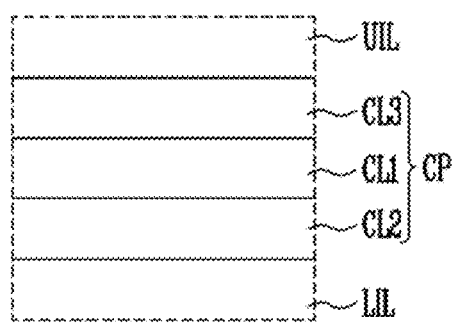

In addition, as illustrated in FIGS. 20 and 22, the conductive patterns CP may include the first conductive layer CL1 provided on the lower insulating layer LIL, the second conductive layer CL2 provided between the lower insulating layer LIL and the first conductive layer CL1, and a third conductive layer CL3 provided on the first conductive layer CL1.

Figure 23:
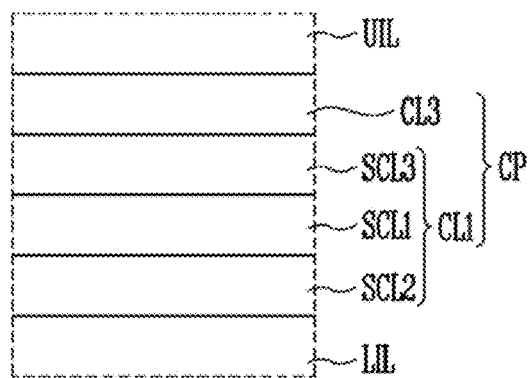

In addition, as illustrated in FIG. 23, the conductive patterns CP may include the first conductive layer CL1 provided on the lower insulating layer LIL and the third conductive layer CL3 provided on the first conductive layer CL1.

The first conductive layer CL1 may have various stacked structures. For example, as illustrated in FIGS. 18, 20 and 23, the first conductive layer CL1 may include the first sub-conductive layer SCL1, the second sub-conductive layer SCL2 provided on the first sub-conductive layer SCL1, and the third sub-conductive layer SCL3 provided on the first sub-conductive layer SCL1.

Figure 21:
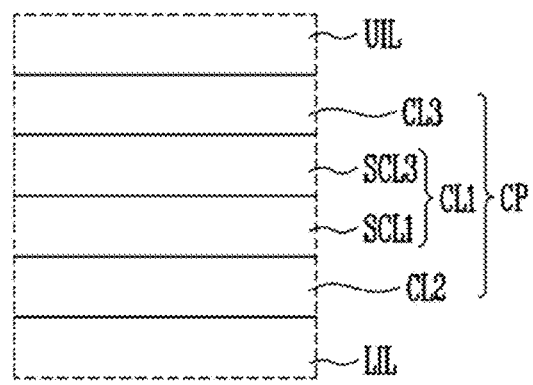

In addition, as illustrated in FIGS. 19 and 21, the first conductive layer CL1 may include the first sub-conductive layer SCL1 provided on the second conductive layer CL2 and the third sub-conductive layer SCL3 provided on the first sub-conductive layer SCL1.

In addition, as illustrated in FIG. 22, the first conductive layer CL1 may include a single conductive layer provided on the second conductive layer CL2. The first conductive layer CL1 may be the first sub-conductive layer SCL1.

The first sub-conductive layer SCL1 may include a metallic material having excellent conductivity, flexibility and malleability. For example, the first sub-conductive layer SCL1 may include at least one of gold (Au), silver (Ag), copper (Cu), aluminum (Al) and an alloy thereof.

The second sub-conductive layer SCL2 may include a material which prevents diffusion of the materials included in the first sub-conductive layer SCL1 and oxidation of the first sub-conductive layer SCL1. For example, the second sub-conductive layer SCL2 may include titanium (Ti).

The 1A-th conductive layer CL1A may further include the third sub-conductive layer SCL3 provided on the first sub-conductive layer SCL1. The third sub-conductive layer SCL3 may prevent oxidation of the first sub-conductive layer SCL1 and include the same material as the second sub-conductive layer SCL2. For example, the third sub-conductive layer SCL3 may include titanium (Ti).

The second conductive layer CL2 may prevent the material included in the lower insulating layer LIL from being diffused into the first conductive layer CL1 and the material included in the first conductive layer CL1 from being diffused into the third interlayer insulating layer IL3. In addition, the second conductive layer CL2 may include a material which does not form an oxide or a composite material by reaction with the organic insulating material of the lower insulating layer LIL. For example, the second conductive layer CL2 may include a metal nitride. The metal nitride may be a nitride of the material included in the second sub-conductive layer SCL2. For example, the second conductive layer CL2 may include titanium nitride (TiNx).

The third conductive layer CL3 may include the same material as the second conductive layer CL2. For example, the third conductive layer CL3 may include a metal nitride. The third conductive layer CL3 may be provided to connect two different conductive patterns CP, such as the first bridge pattern BRP1 and the second bridge pattern BRP2 as illustrated in FIGS. 5, 6, and 17. The third conductive layer CL3 may be included in the lower conductive pattern CP between the two conductive patterns CP, for example, the first bridge pattern BRP1.

According to an embodiment, a conductive pattern arranged on an organic layer may be prevented from reacting with the organic layer to generate an oxide or a composite material. Therefore, an increase in number of etch processes performed to form the conductive pattern caused by the oxide or the composite material may be avoided. Accordingly, manufacturing time of a display device having the conductive pattern may be reduced.

Although exemplary embodiments are disclosed herein, these embodiments should not be construed to limit a scope of the inventive concept. Those of ordinary skill in the art would recognize that various changes in form and details may be made without departing from the spirit and scope.

What is claimed is:

1. A conductive pattern, comprising:
an insulating layer including organic material;
a first conductive layer provided on the insulating layer and including a first sub-conductive layer and a second sub-conductive layer; and
an additional conductive layer provided between the insulating layer and the first conductive layer,
wherein the additional conductive layer includes a metal nitride which directly contacts the organic material, and
wherein the second sub-conductive layer is provided between the additional conductive layer and the first sub-conductive layer.

2. The conductive pattern of claim 1, wherein the additional conductive layer is a second conductive layer provided between the insulating layer and the first conductive layer.

3. The conductive pattern of claim 2, wherein
the second conductive layer includes a nitride of a material included in the second sub-conductive layer.

4. The conductive pattern of claim 3, wherein the second sub-conductive layer includes titanium (Ti).

5. The conductive pattern of claim 4, wherein the second conductive layer includes a titanium nitride.

6. The conductive pattern of claim 3, further comprising a third sub-conductive layer provided on the first sub-conductive layer,
wherein the third sub-conductive layer includes the same material as the second sub-conductive layer.

7. The conductive pattern of claim 6, wherein the third sub-conductive layer includes titanium (Ti).

8. The conductive pattern of claim 3, further comprising a third conductive layer provided on the first sub-conductive layer,
wherein the third conductive layer includes the same material as the second conductive layer.

9. The conductive pattern of claim 8, wherein the second conductive layer includes a titanium nitride.

10. The conductive pattern of claim 2, further comprising a third sub-conductive layer provided on the first sub-conductive layer,
wherein the second conductive layer includes a nitride of a material included in the third sub-conductive layer.

11. The conductive pattern of claim 10, further comprising a third conductive layer provided on the third sub-conductive layer,
wherein the third conductive layer includes the same material as the second conductive layer.

12. The conductive pattern of claim 2, further comprising a third conductive layer provided on the first sub-conductive layer,
wherein the third conductive layer includes a metal nitride.

13. The conductive pattern of claim 12, wherein the second conductive layer and the third conductive layer include a titanium nitride.

14. The conductive pattern of claim 2, wherein the first sub-conductive layer includes at least one of gold (Au), silver (Ag), copper (Cu), aluminum (Al) and an alloy thereof.

15. A display device, comprising:
a substrate including a display area and a non-display area;
at least one transistor provided in the display area of the substrate;
a first insulating layer covering the transistor;
a first bridge pattern provided on the first insulating layer and connected to the transistor;
a second insulating layer covering the first bridge pattern and including an organic insulating material;
a second bridge pattern provided on the second insulating layer and connected to the first bridge pattern; and
a display element connected to the second bridge pattern,
wherein the second bridge pattern comprises:
a first conductive layer including at least a first sub-conductive layer; and
a second conductive layer provided between the second insulating layer and the first conductive layer,
wherein the second conductive layer includes a metal nitride which directly contacts the organic material.

16. The display device of claim 15, wherein the first conductive layer further comprises a second sub-conductive layer provided between the second conductive layer and the first sub-conductive layer, and the second conductive layer includes a nitride of a material included in the second sub-conductive layer.

17. The display device of claim 16, wherein the second sub-conductive layer includes titanium (Ti), and
the second conductive layer includes a titanium nitride.

18. The display device of claim 16, further comprising a third sub-conductive layer provided on the first sub-conductive layer,
wherein the third sub-conductive layer includes the same material as the second sub-conductive layer.

19. The display device of claim 18, wherein the third sub-conductive layer includes titanium (Ti), and
the second conductive layer includes a titanium nitride.

20. The display device of claim 18, wherein the transistor includes an active pattern, a gate electrode, a source electrode and a drain electrode provided on the substrate, the source electrode and the drain electrode extending from both sides of the active pattern, and
each of the source electrode and the drain electrode includes a semiconductor layer doped with impurities, and the active pattern includes a semiconductor layer undoped with impurities.

21. The display device of claim 20, wherein the first insulating layer includes an organic insulating material,
wherein the first bridge pattern comprises:
a first conductive layer provided on the first insulating layer and including at least a first sub-conductive layer; and
a second conductive layer provided between the first insulating layer and the first conductive layer,
wherein the second conductive layer includes a metal nitride.

22. The display device of claim 21, wherein in the first bridge pattern, the first conductive layer further comprises a second sub-conductive layer provided between the second conductive layer and the first sub-conductive layer, and the second conductive layer includes a nitride of a material included in the second sub-conductive layer.

23. The display device of claim 22, wherein in the first bridge pattern, the second sub-conductive layer includes titanium (Ti) and the second conductive layer includes a titanium nitride.

24. The display device of claim 22, further comprising a third sub-conductive layer provided on the first sub-conductive layer in the first bridge pattern, wherein the third sub-conductive layer includes the same material as the second sub-conductive layer.

25. The display device of claim 24, wherein in the first bridge pattern, the third sub-conductive layer includes titanium (Ti), and the second conductive layer includes a titanium nitride.

26. The display device of claim 21, further comprising a third sub-conductive layer provided on the first sub-conductive layer in the first bridge pattern, wherein the second conductive layer includes a nitride of a material included in the third sub-conductive layer.

27. The display device of claim 21, further comprising a third conductive layer provided on the first sub-conductive layer in the first bridge pattern, wherein the third conductive layer includes the same material as the second conductive layer.

28. The display device of claim 15, further comprising a third sub-conductive layer provided on the first sub-conductive layer,
wherein the second conductive layer includes a nitride of a material included in the third sub-conductive layer.

29. A display device, comprising:
a substrate including a display area and a non-display area;
at least one transistor provided in the display area of the substrate;
a display element connected to the transistor; and
a conductive pattern connected to the transistor or the display element and provided on an organic layer,
wherein the conductive pattern comprises:
a first conductive layer including a first sub-conductive layer and a second sub-conductive layer; and
a second conductive layer provided between the organic layer and the first conductive layer,
wherein the second conductive layer includes a metal nitride which directly contacts the organic material, and
wherein the second sub-conductive layer is provided between the second conductive layer and the first sub-conductive layer.

30. The display device of claim 29, wherein
the second conductive layer includes a nitride of a material included in the second sub-conductive layer.

31. The display device of claim 30, wherein the second sub-conductive layer includes titanium (Ti), and
the second conductive layer includes a titanium nitride.

32. The display device of claim 30, further comprising a third sub-conductive layer provided on the first sub-conductive layer,
wherein the third sub-conductive layer includes the same material as the second sub-conductive layer.

33. The display device of claim 32, wherein the third sub-conductive layer includes titanium (Ti), and
the second conductive layer includes a titanium nitride.

34. The display device of claim 30, further comprising a third conductive layer provided on the first sub-conductive layer,
wherein the third conductive layer includes the same material as the second conductive layer.

35. The display device of claim 29, further comprising a third sub-conductive layer provided on the first sub-conductive layer,
wherein the second conductive layer includes a nitride of a material included in the third sub-conductive layer.

36. The display device of claim 35, further comprising a third conductive layer provided on the third sub-conductive layer,
wherein the third conductive layer includes the same material as the second conductive layer.

37. The display device of claim 29, further comprising a third conductive layer provided on the first sub-conductive layer,
wherein the third conductive layer includes the same material as the second conductive layer.

38. A conductive pattern, comprising:
an insulating layer including organic material;
a first conductive layer provided on the insulating layer and including a first sub-conductive layer and a second sub-conductive layer; and
an additional conductive layer provided between the insulating layer and the first conductive layer,
wherein the additional conductive layer is disposed directly on the organic material and includes a material not reacting with the organic material, and
wherein the second sub-conductive layer is provided between the additional conductive layer and the first sub-conductive layer.

39. The conductive pattern of claim 38, wherein the additional conductive layer is a second conductive layer provided between the insulating layer and the first conductive layer.

40. The conductive pattern of claim 39, wherein the second conductive layer includes a metal nitride.

41. The conductive pattern of claim 40, wherein
the second conductive layer includes a nitride of a material included in the second sub-conductive layer.

42. The conductive pattern of claim 41, wherein the second sub-conductive layer includes titanium (Ti), and
the second conductive layer includes a titanium nitride.

43. The conductive pattern of claim 41, further comprising a third sub-conductive layer provided on the first sub-conductive layer,
wherein the third sub-conductive layer includes the same material as the second sub-conductive layer.

44. The conductive pattern of claim 43, wherein the third sub-conductive layer includes titanium (Ti), and
the second conductive layer includes a titanium nitride.

45. The conductive pattern of claim 41, further comprising a third conductive layer provided on the first sub-conductive layer,
wherein the third conductive layer includes the same material as the second conductive layer.

46. The conductive pattern of claim 40, further comprising a third sub-conductive layer provided on the first sub-conductive layer,
wherein the second conductive layer includes a nitride of a material included in the third sub-conductive layer.

47. The conductive pattern of claim 46, further comprising a third conductive layer provided on the third sub-conductive layer,
wherein the third conductive layer includes the same material as the second conductive layer.

* * * * *